US012558835B1

(12) United States Patent
Hashemi et al.

(10) Patent No.: US 12,558,835 B1
(45) Date of Patent: Feb. 24, 2026

(54) FABRICATION OF ASYMMETRIC MANDREL STRUCTURES IN SEMICONDUCTOR DEVICE

(71) Applicant: International Business Machines Corporation, Armonk, NY (US)

(72) Inventors: Pouya Hashemi, Purchase, NY (US); Steven Holmes, Red Hook, NY (US); Robert L. Bruce, White Plains, NY (US); Eric A Joseph, Croton on Hudson, NY (US); Yanning Sun, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 18/189,195

(22) Filed: Mar. 23, 2023

(51) Int. Cl.
    *B29C 59/02* (2006.01)
    *H01L 21/033* (2006.01)

(52) U.S. Cl.
    CPC .......... *B29C 59/022* (2013.01); *B29C 59/026* (2013.01); *H01L 21/0337* (2013.01)

(58) Field of Classification Search
    CPC ............... B29C 59/022; B29C 59/026; B29C 2043/025; H01L 21/0337
    See application file for complete search history.

(56) References Cited

U.S. PATENT DOCUMENTS

| | | | |
|---|---|---|---|
| 4,424,102 A | 1/1984 | Brandeis | |
| 6,420,713 B1 | 7/2002 | Stickel | |

| | | | |
|---|---|---|---|
| 6,982,442 B2 | 1/2006 | Chan | |
| 8,343,877 B2 | 1/2013 | Cheng | |
| 8,853,752 B2 | 10/2014 | Bazizi | |
| 9,299,787 B1 | 3/2016 | Cheng | |
| 9,972,677 B2 | 5/2018 | Van Brunt | |
| 10,026,613 B2 | 7/2018 | Srinivasan | |
| 10,128,083 B2 | 11/2018 | Druz | |
| 10,347,501 B2 | 7/2019 | Liu | |
| 10,388,493 B2 | 8/2019 | Singh | |

(Continued)

FOREIGN PATENT DOCUMENTS

| | | |
|---|---|---|
| CN | 107731890 A | 2/2018 |
| CN | 111524798 B | 5/2022 |

OTHER PUBLICATIONS

Aguinsky, et al., "Phenomenological modeling of low-bias sulfur hexafluoride plasma etching of silicon", Solid-State Electronics, Vo. 191, Article 108262, Feb. 25, 2022, 8 pages.

(Continued)

*Primary Examiner* — Alonzo Chambliss
(74) *Attorney, Agent, or Firm* — Kimberly Zillig

(57) ABSTRACT

A semiconductor structure includes a first plurality of mandrel structures extending outwardly from a substrate. Each of the first plurality of mandrel structures includes a first side at a first inclination angle with respect to a surface plane of the substrate and a second side at a second inclination angle with respect to the surface plane of the substrate. A second plurality of mandrel structures extend outwardly from the substrate. Each of the second plurality of mandrel structures include a third side at a third inclination angle with respect to the surface plane of the substrate and a fourth side at a fourth inclination angle with respect to the surface plane of the substrate. A template structure for an imprint mask is formed by the first plurality of mandrel structures and the second plurality of mandrel structures.

15 Claims, 17 Drawing Sheets

(56) References Cited

U.S. PATENT DOCUMENTS

| | | | |
|---|---|---|---|
| 10,510,743 | B2 | 12/2019 | Han |
| 10,818,505 | B2 | 10/2020 | Wang |
| 11,010,526 | B2 | 5/2021 | Wang |
| 2005/0151165 | A1 | 7/2005 | Chan |
| 2011/0111592 | A1 | 5/2011 | Cheng |
| 2013/0072025 | A1 | 3/2013 | Singh |
| 2013/0330511 | A1 | 12/2013 | Sharifi |
| 2014/0117417 | A1 | 5/2014 | Bazizi |
| 2015/0097204 | A1* | 4/2015 | Takada ................. H10H 20/855 216/49 |
| 2015/0333223 | A1* | 11/2015 | Wu ........................ H10H 20/01 438/27 |
| 2016/0093695 | A1 | 3/2016 | Cheng |
| 2017/0047396 | A1 | 2/2017 | Van Brunt |
| 2017/0330750 | A1 | 11/2017 | Srinivasan |
| 2018/0130668 | A1 | 5/2018 | Liu |
| 2019/0027470 | A1 | 1/2019 | Han |
| 2019/0067020 | A1 | 2/2019 | Tsai et al. |
| 2019/0369321 | A1* | 12/2019 | Young ................ G02B 27/0172 |
| 2020/0058514 | A1 | 2/2020 | Wang |
| 2020/0134250 | A1 | 4/2020 | Wang |
| 2020/0249386 | A1* | 8/2020 | Mohanty .............. G02B 6/0065 |
| 2021/0249351 | A1 | 8/2021 | Anderson et al. |
| 2022/0057710 | A1 | 2/2022 | Young et al. |
| 2022/0246433 | A1 | 8/2022 | Lin |
| 2022/0359217 | A1 | 11/2022 | Andersen |
| 2024/0248240 | A1 | 7/2024 | Hansson |

OTHER PUBLICATIONS

Arya, et al., "Which factor determines the optical losses in refractory tungsten thin films at high temperatures?", Applied Surface Science, Issue 588, Article 12927, Mar. 4, 2022, 10 pages.

Hashemi, et al., "Fabrication of Angled Mandrel Structures in Semiconductor Device", U.S. Appl. No. 18/189,185, filed Mar. 23, 2023.

Holmes et al., "Guiding Structures for Fabrication of Angled Features in a Semiconductor Device", U.S. Appl. No. 18/189,189, filed Mar. 23, 2023.

IBM, List of IBM Patents or Patent Applications Treated as Related, Filed Herewith, 2 pages.

Ip et al., "Reactive ion beam etch of slanted gratings for augmented reality", Proceedings of SPIE 11696, Advanced Fabrication Technologies for Micro/Nano Optics and Photonics XIV, 1169604, Mar. 5, 2021, Video Presentation Transcript, 5 pages, <https://doi.org/10.1117/12.2582875>.

Ip et al., "Reactive ion beam etch of slanted gratings for augmented reality," https://doi.org/10.1117/12.2582752, Proceedings vol. 11615, Advanced Etch Technology and Process Integration for Nanopatterning X, vol. 116150, Abstract Only, Feb. 22, 2021, 1 page, <https://doi.org/10.1117/12.2582752>.

Kim, et al., "Macroscopic mapping of microscale fibers in freeform injection molded fiber-reinforced composites using X-ray scattering tensor tomography," Composites Part B, Issue 233, Article 109634, Jan. 20, 2022, 11 pages.

Shi et al., "High aspect ratio tilted gratings through local electric field modulation in plasma etching," Applied Surface Science 588 (2022) 152938, 10 pages, <https://doi.org/10.1016/j.apsusc.2022.152938>.

Stark, et al., "Slanted gratings with varying slant angle by localized reactive ion beam processing", Proceedings of SPIE Digital Optical Technologies 2021, vol. 11788, 8 pages.

Xiong et al., "Augmented reality and virtual reality displays: emerging technologies and future perspectives," Light: Science & Applications (2021) 10:216, pp. 1-30.

* cited by examiner

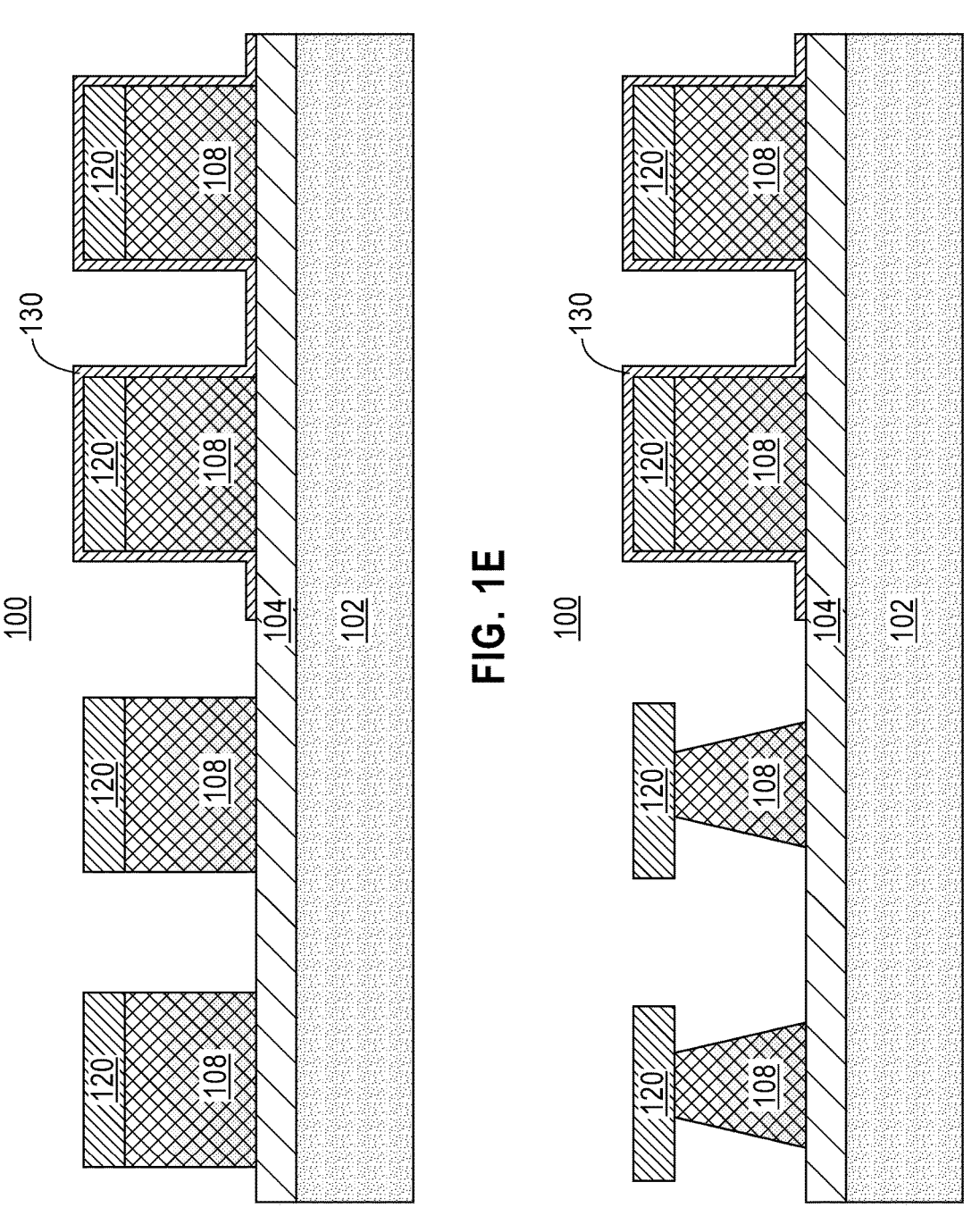

200

200

200

200

FABRICATION OF ASYMMETRIC MANDREL STRUCTURES IN SEMICONDUCTOR DEVICE

BACKGROUND

The present invention generally relates to the field of semiconductor devices, and more particularly to nanofabrication techniques and structures.

An artificial reality system, such as a head-mounted display (HMD) or heads-up display (HUD) system, generally includes a display configured to present artificial images that depict objects in a virtual environment. The display may show virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). The optical components are arranged to transport light of the desired image, where the light is generated on the display to the user's eye to make the image visible to the user. The display where the image is generated can form part of a light engine, so the image generates collimated light beams guided by the optical component to provide an image visible to the user.

In some implementations, the light of the projected images may be coupled into or out of the waveguide using a diffractive optical element, such as a slanted surface-relief grating. Slanted gratings show high efficiency in coupling light into waveguides. However, fabrication of master molds used for producing slanted gratings require high etch selectivity between $SiO_2$ and a metal mask. Additionally, the industry standard for trench etch, reactive ion etching (RIE), cannot produce slanted trenches, and other techniques such as reactive ion beam etching (RIBE) can only produce slanted trenches at a single angle and at a single direction. Therefore, there is a need for improved designs and techniques for producing slanted trench features within a substrate.

SUMMARY

According to an embodiment of the present disclosure, a semiconductor structure includes a first plurality of mandrel structures extending outwardly from a substrate, each of the first plurality of mandrel structures including a first side and a second side, the second side opposing the first side, the first side of each of the first plurality of mandrel structures being at a first inclination angle with respect to a surface plane of the substrate, and the second side of each of the first plurality of mandrel structures being at a second inclination angle with respect to the surface plane of the substrate. A second plurality of mandrel structures extend outwardly from the substrate, each of the second plurality of mandrel structures include a third side and a fourth side, the fourth side opposing the third side, the third side of each of the second plurality of mandrel structures being at a third inclination angle with respect to the surface plane of the substrate, and the fourth side of each of the second plurality of mandrel structures being at a fourth inclination angle with respect to the surface plane of the substrate. A template structure for an imprint mask is formed by the first plurality of mandrel structures and the second plurality of mandrel structures.

According to another embodiment of the present disclosure, a semiconductor structure includes one or more angled mandrel structures disposed above and in contact with a substrate, the one or more angled mandrel structures extend outwardly at an inclination angle with respect to a surface plane of the substrate that is different from 90 degrees, and a first sidewall spacer disposed along a first sidewall of the one or more angled mandrel structures, a first side of the first sidewall spacer being in direct contact with the first sidewall of the one or more angled mandrel structures, and a second side of the first sidewall spacer, opposing the first side of the first sidewall spacer, being at a first sidewall spacer inclination angle with respect to the surface plane of the substrate that is different from the inclination angle of the one or more angled mandrel structures.

According to another embodiment of the present disclosure, a method of forming a semiconductor structure includes forming a first plurality of mandrel structures extending outwardly from a substrate, each of the first plurality of mandrel structures including a first side and a second side opposing the first side, the first side of each of the first plurality of mandrel structures being at a first inclination angle with respect to a surface plane of the substrate, and the second side of each of the first plurality of mandrel structures being at a second inclination angle with respect to the surface plane of the substrate, forming a second plurality of mandrel structures extending outwardly from the substrate, the second plurality of mandrel structures including a third side and a fourth side opposing the third side, the third side of each of the second plurality of mandrel structures being at a third inclination angle with respect to the surface plane of the substrate, and the fourth side of each of the second plurality of mandrel structures being at a fourth inclination angle with respect to the surface plane of the substrate; and forming a template structure for an imprint mask including the first plurality of mandrel structures and the second plurality of mandrel structures.

BRIEF DESCRIPTION OF THE DRAWINGS

The following detailed description, given by way of example and not intended to limit the invention solely thereto, will best be appreciated in conjunction with the accompanying drawings, in which:

FIG. 1E is a cross-sectional view of the first semiconductor structure depicting selectively removing uncovered portions of the second hardmask layer, according to an embodiment of the present disclosure;

FIG. 1F is a cross-sectional view of the first semiconductor structure depicting selectively recessing exposed portions of the first epitaxial layer, according to an embodiment of the present disclosure;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
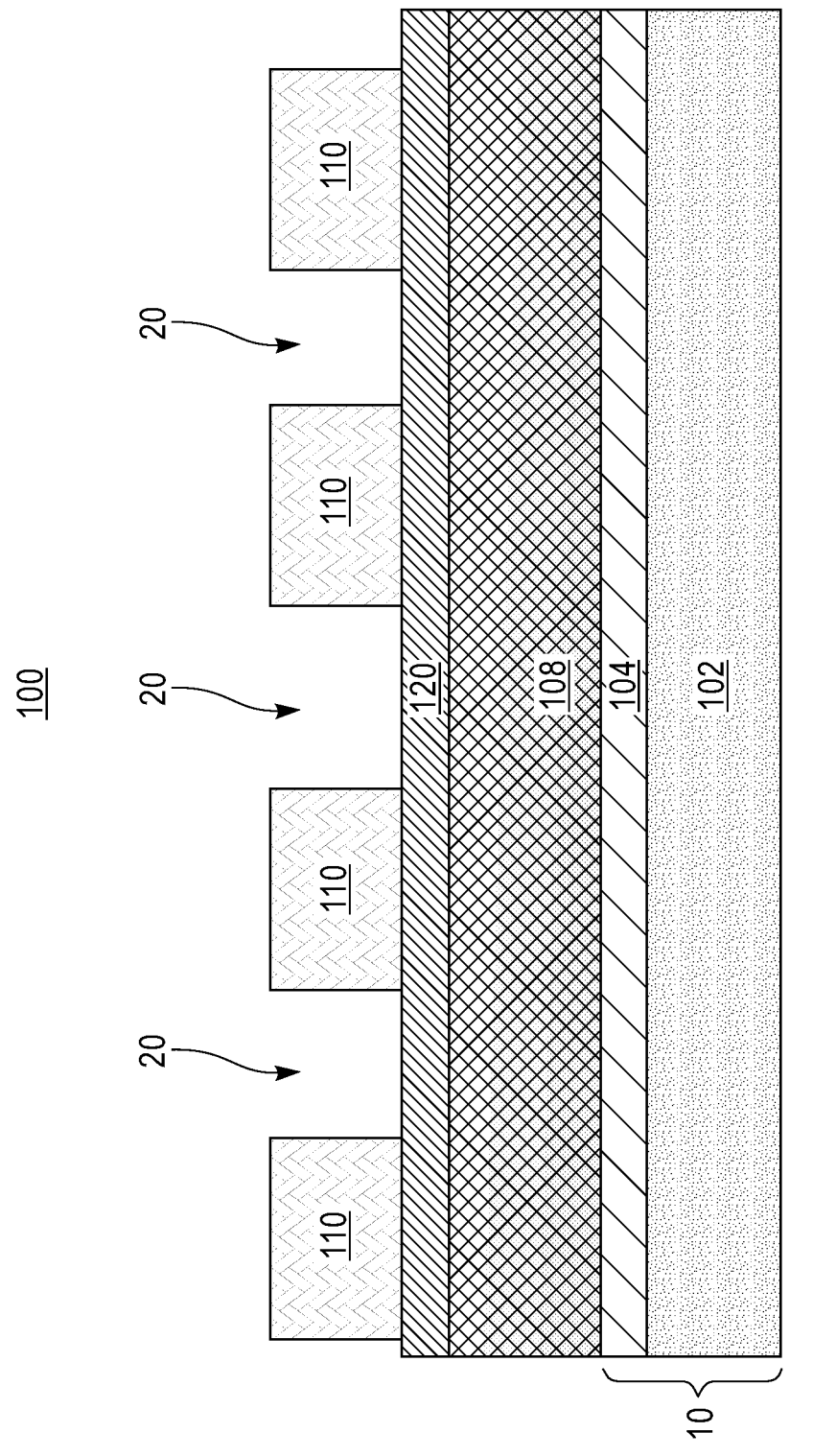
FIG. 1A is a cross-sectional view of a first semiconductor structure at an intermediate step during a semiconductor manufacturing process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Fabrication of slanted or angled trench features vertically into a substrate are needed for augmented reality (AR) devices. Current state-of-the-art technology uses reactive ion beam etching (RIBE) at an angle to form such features by means of tilting the entire wafer inside the etch chamber. In such a system, only single angle trench features at a single direction can be formed on the substrate. Moreover, the use of reactive ion beam etching for forming angled features for augmented reality displays may hinder reaching a needed depth due to redeposition issues during the etch process and low selectivity of the etch mask. In some cases, the critical dimension (CD) and profile control of angled mandrel structures that are used as mold can also be degraded by the redeposition issues.

As a result, it may be desired to form mandrel structures at a variety of different angles and at a variety of different orientations (e.g., X and Y orientations) on the same substrate at the same time such that the mandrel structures can be used as a mold for nanoimprint lithography (NIL) for forming angled trench features. Wafer-level NIL has increasingly become a key enabling technology to support AR devices, optical sensors, and biomedical chips, among other technologies. NIL may allow mass manufacture of micro- and nano-scale structures with a maximum degree of freedom for the device dimensions. Another key advantage of this replication-based technology is, given by the fact that even complex structures which require precise and time-consuming fabrication methods can be transferred to mass manufacturing in an efficient semiconductor manufacturing line. Additionally, for many devices especially for optical applications the replicated layer can be directly used as functional layer in the product.

Therefore, embodiments of the present disclosure provide a semiconductor structure, and a method of making the same, including a plurality of mandrel structures having asymmetric profiles that can function as a mold for nanoimprint lithography and/or as optical waveguides in augmented reality displays. More particularly, the proposed embodiments allow forming mandrel structures in which an inclination angle of each side of the mandrel structures can be selectively controlled as desired.

Embodiments by which the mandrel structures with asymmetric profiles can be formed are described in detailed below by referring to the accompanying drawings in FIGS. 1A-3F.

Referring now to FIG. 1A, a cross-sectional view of a first semiconductor structure 100 at an intermediate step during a semiconductor manufacturing process is shown, according to an embodiment of the present disclosure.

At this step of the semiconductor manufacturing process, the first semiconductor structure 100 includes a substrate 10 that may be a silicon-on-insulator (SOI) substrate. In embodiments in which the substrate 10 is an SOI substrate, the substrate 10 is typically composed of a base substrate 102, a buried dielectric layer 104 (e.g., buried oxide) formed on top of the base substrate 102, and a SOI layer (not shown) formed on top of the buried dielectric layer 104. According to an embodiment, the buried dielectric layer 104 and SOI layer (not shown) are vertically stacked one on top of another in a direction perpendicular to the base substrate 102, as illustrated in the figure. The buried dielectric layer 104 isolates the SOI layer from the base substrate 102.

The base substrate 102 may be made from any of several known semiconductor materials such as, for example, silicon, poly-crystalline silicon, amorphous silicon, germanium, silicon-germanium alloy, poly-crystalline silicon-germanium, amorphous silicon-germanium, silicon carbide, silicon-germanium carbide alloy, and compound (e.g., III-V and II-VI) semiconductor materials. Non-limiting examples of compound semiconductor materials include gallium arsenide, indium arsenide, and indium phosphide. Typically, the base substrate 102 may be about, but is not limited to, several hundred microns thick. For example, the base substrate 102 may include a thickness ranging from 0.5 mm to about 1.5 mm. In some embodiments, the base substrate 102 may be, for example, a bulk substrate.

The buried dielectric layer 104 may be formed from any of several known dielectric materials. Non-limiting examples of dielectric materials may include oxides, nitrides and oxynitrides of silicon. Oxides, nitrides and oxynitrides of other elements are also envisioned. In addition, the buried dielectric layer 104 may include a crystalline or non-crystalline dielectric material. Moreover, the buried dielectric layer 104 may be formed using any of several known methods. Non-limiting examples include ion implantation methods, thermal or plasma oxidation or nitridation methods, chemical vapor deposition methods and physical vapor deposition methods. The buried dielectric layer 104 may include a thickness ranging from approximately 20 nm to approximately 100 nm, and ranges therebetween.

For case of illustration, without intent of limitation, the SOI layer of the substrate 10 is not depicted in FIG. 1A. However, as known by those skilled in the art, an initial configuration of the substrate 10 prior to forming the first epitaxial layer 108 is substantially the same as the one described in FIG. 2A. The SOI layer may include any of the several semiconductor materials included in the base substrate 102. In general, the base substrate 102 and the SOI layer may be made of either identical or different semiconductor materials with respect to chemical composition, dopant concentration and crystallographic orientation. In an embodiment of the present invention, the base substrate 102 and the SOI layer are made of silicon. The SOI layer may have a thickness varying preferably from approximately 250 nm to approximately 300 nm. Although, in some embodiments, the SOI layer 106 may have a thickness of up to 500 nm. As may be known by those skilled in the art, in some embodiments, the SOI layer may be entirely consumed during subsequent patterning processes. Methods for forming the SOI layer are well known in the art and will not be described in detail herein to avoid unnecessarily obscuring the presented embodiments.

Although not depicted in the figure, in this embodiment, a thickness of the SOI layer can be substantially reduced or thinned using, for example, an oxidation process followed by DHF cleaning (the process of thinning the SOI layer is described in detail below with reference to FIG. 2A). The thickness of the SOI layer is reduced prior to forming the first epitaxial layer 108 such that the thinned SOI layer may function as a seed layer for the epitaxial growth process conducted to form the first epitaxial layer 108. Accordingly, in this embodiment, a thickness of the SOI layer (not shown) may be reduced to approximately 1 nm to approximately 10 nm, and ranges therebetween, and may be consumed entirely during formation of the first epitaxial layer 108.

Accordingly, the first epitaxial layer 108 may be formed off the thinned SOI layer (not shown) using an epitaxial growth process. In one or more embodiments, the first epitaxial layer 108 includes a graded layer (a layer that includes two or more materials, the materials having a different ratio at top and the bottom ends of said layer). By grading the first epitaxial layer 108, the number of defects within the layer can be reduced.

In an embodiment, the first epitaxial layer 108 includes a silicon-germanium layer that is linearly graded, e.g., $Si_{1-x}Ge_x$. In this embodiment, the concentration of germanium atoms is higher at the top end of the first epitaxial layer 108 and lower at the bottom end of the first epitaxial layer 108. In a linearly graded layer, the chemical composition varies continuously, and every horizontal slice of the layer can yield a different composition. The degree of similarity between proximate slices depends upon the thickness of the layer and the degree of change in chemical composition between the top and bottom ends of the layer. In an exemplary embodiment, the first epitaxial layer 108 may be epitaxially grown to a thickness varying from approximately 100 nm and 500 nm, although other thicknesses are within the contemplated scope of the invention. Preferably, the second epitaxial layer 110 is grown to a thickness varying from approximately 300 nm and 400 nm.

For example, in one particular embodiment, the first epitaxial layer 108 can have 100% Si and 0% Ge where it contacts the buried dielectric layer 104. The first epitaxial layer 108 can be graded gradually, such that it has about 20% to 60% Si and 80% to 40% Ge at the top end of the first epitaxial layer 108 where it contacts the first hardmask layer 120. In one embodiment, the first epitaxial layer 108 includes a SiGe layer that is graded gradually from 100% Si at the bottom end to 40% Si at the top end of the second epitaxial layer 110.

In general, the first epitaxial layer 108 can be formed by epitaxial growth by using the thinned SOI layer (not shown) as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultrahigh vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 300° C. to 900° C. Although higher temperatures typically result in faster deposition, the faster deposition may result in crystal defects and film cracking.

Several different precursors may be used for the epitaxial growth of the first epitaxial layer 108. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

With continued reference to FIG. 1A, a first hardmask layer 120 is formed above and in direct contact with the first epitaxial layer 108. In one or more embodiments, the first hardmask layer 120 is composed of a dielectric material such as, for example, silicon dioxide, silicon nitride, silicon carbide, or a combination of such materials forming a multiple stack hardmask. Any known dielectric deposition process can be conducted to form the first hardmask layer 120. In an exemplary embodiment, a thickness of the first hardmask layer 120 may vary from approximately 50 nm to approximately 1000 nm and ranges therebetween, although a thickness less than 50 nm and greater than 200 nm may be acceptable.

A first photoresist layer 110 can then be formed above the first hardmask layer 120. A first pattern 20 is exposed on the first photoresist layer 110 to be transferred to the first epitaxial layer 108, as will be described in detail below.

Figures 1B, 1C:
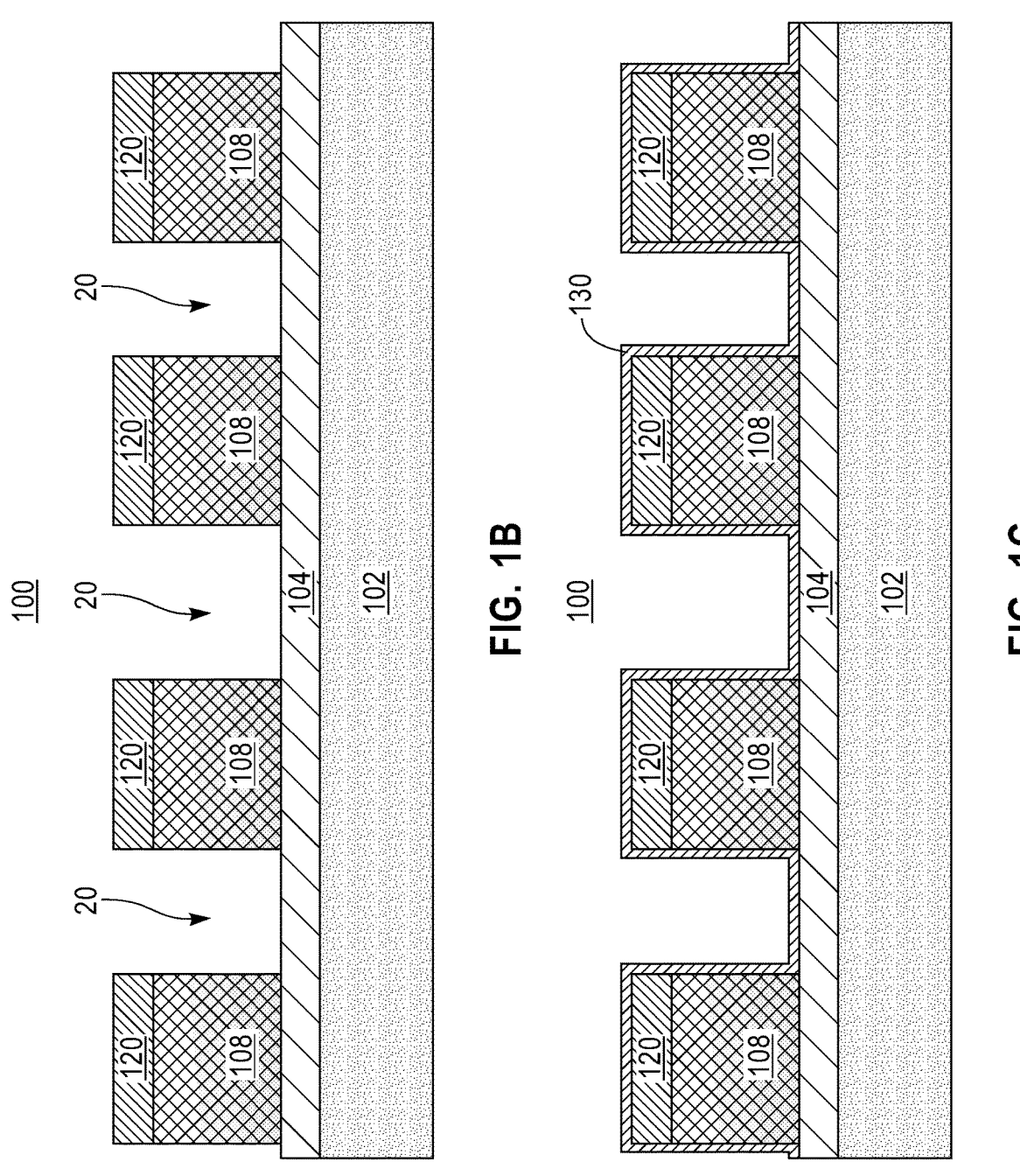
FIG. 1B is a cross-sectional view of the first semiconductor structure depicting patterning of a first epitaxial layer, according to an embodiment of the present disclosure.
FIG. 1C is a cross-sectional view of the first semiconductor structure depicting forming a second hardmask layer, according to an embodiment of the present disclosure.

Referring now to FIG. 1B, a cross-sectional view of the first semiconductor structure 100 is shown after patterning the first epitaxial layer 108, according to an embodiment of the present disclosure.

Well-known lithography and reactive ion etch (RIE) processing can be used to pattern the first epitaxial layer 108. Patterning of the first epitaxial layer 108 involves exposing the first pattern 20 on the first photoresist layer 110 and transferring the exposed pattern to the first hardmask layer 120 and then to the first epitaxial layer 108. After transferring the first pattern 20 to the first epitaxial layer 108, the first photoresist layer 110 can be removed using any photoresist striping method known in the art including, for example, plasma ashing.

The etching process used to pattern the first epitaxial layer 108 can be conducted until reaching an uppermost surface of the buried dielectric layer 104, as depicted in the figure. Thus, in this embodiment, the buried dielectric layer 104 acts as an etch stop layer. After the patterning process, a plurality of first epitaxial layer 108 portions or pillars remain above the buried dielectric layer 104.

Figure 1D:
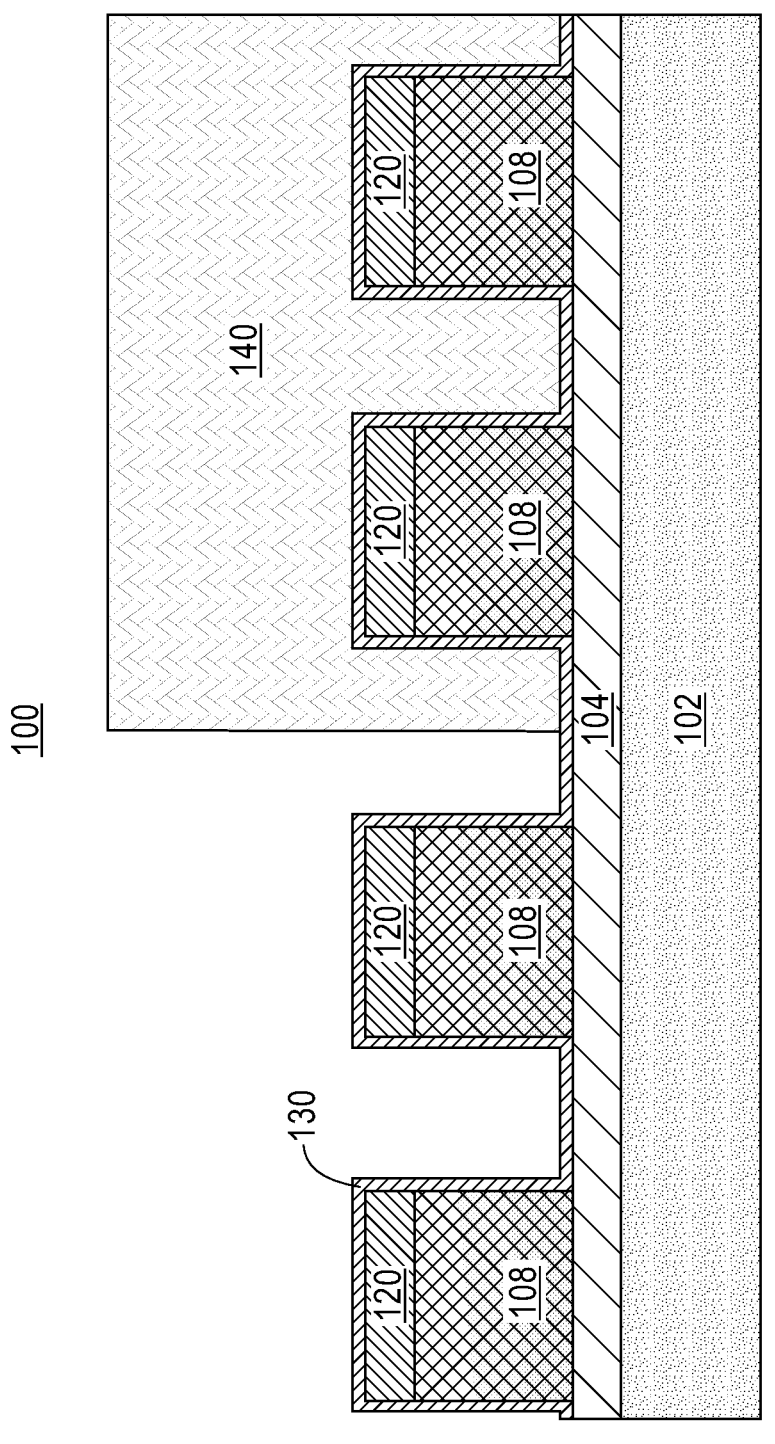
FIG. 1D is a cross-sectional view of the first semiconductor structure depicting forming and lithographically defining a photoresist layer above portions of the first epitaxial layer to form a first block mask, according to an embodiment of the present disclosure.

Referring now to FIGS. 1C-1E simultaneously, cross-sectional views of the first semiconductor structure 100 are shown after conformally depositing a second hardmask layer 130, forming a first block mask 140 on selected portions of the first epitaxial layer 108, etching portions of the second hardmask layer 130 not covered by the first block mask 140, and removing the first block mask 140, according to an embodiment of the present disclosure.

The second hardmask layer 130 can be formed above and in direct contact with an uppermost surface of the buried dielectric layer 104, an uppermost surface and (opposite) sidewalls of the first hardmask layer 120, and (opposite) sidewalls of each pillar or portion of the first epitaxial layer 108. Non-limiting examples of conformal deposition processes to form the second hardmask layer 130 may include chemical vapor deposition (CVD), atomic layer deposition (ALD), plasma enhanced chemical vapor deposition (PECVD), and the like.

Similar to the first hardmask layer 120, the second hardmask layer 130 is composed of a dielectric material such as, for example, silicon dioxide, silicon nitride, silicon carbide, or a combination of such materials forming a multiple stack hardmask. A thickness of the second hardmask layer 130 may vary from approximately 10 nm to approximately 100 nm and ranges therebetween, although other thicknesses are within the contemplated scope of the invention.

As illustrated in FIG. 1D, a photoresist layer can be deposited and lithographically defined above second portions of the first epitaxial layer 108 to form a first block mask 140. First portions of the first epitaxial layer 108, adjacent to the second portions, are not covered by the first block mask 140. The first block mask 140 protects the second portions of the first epitaxial layer 108 during selective etching of uncovered portions of the second hardmask layer 130.

After selectively removing the uncovered portions of the second hardmask layer 130, the first block mask 140 can be removed using any photoresist striping method known in the art including, for example, plasma ashing. As shown in FIG. 1E, the second hardmask layer 130 remains above the second portions of the first epitaxial layer 108, while first portions of the first epitaxial layer 108 adjacent to the second portions are laterally exposed being covered only on a top surface by the first hardmask layer 120.

Figures 1G, 1H:
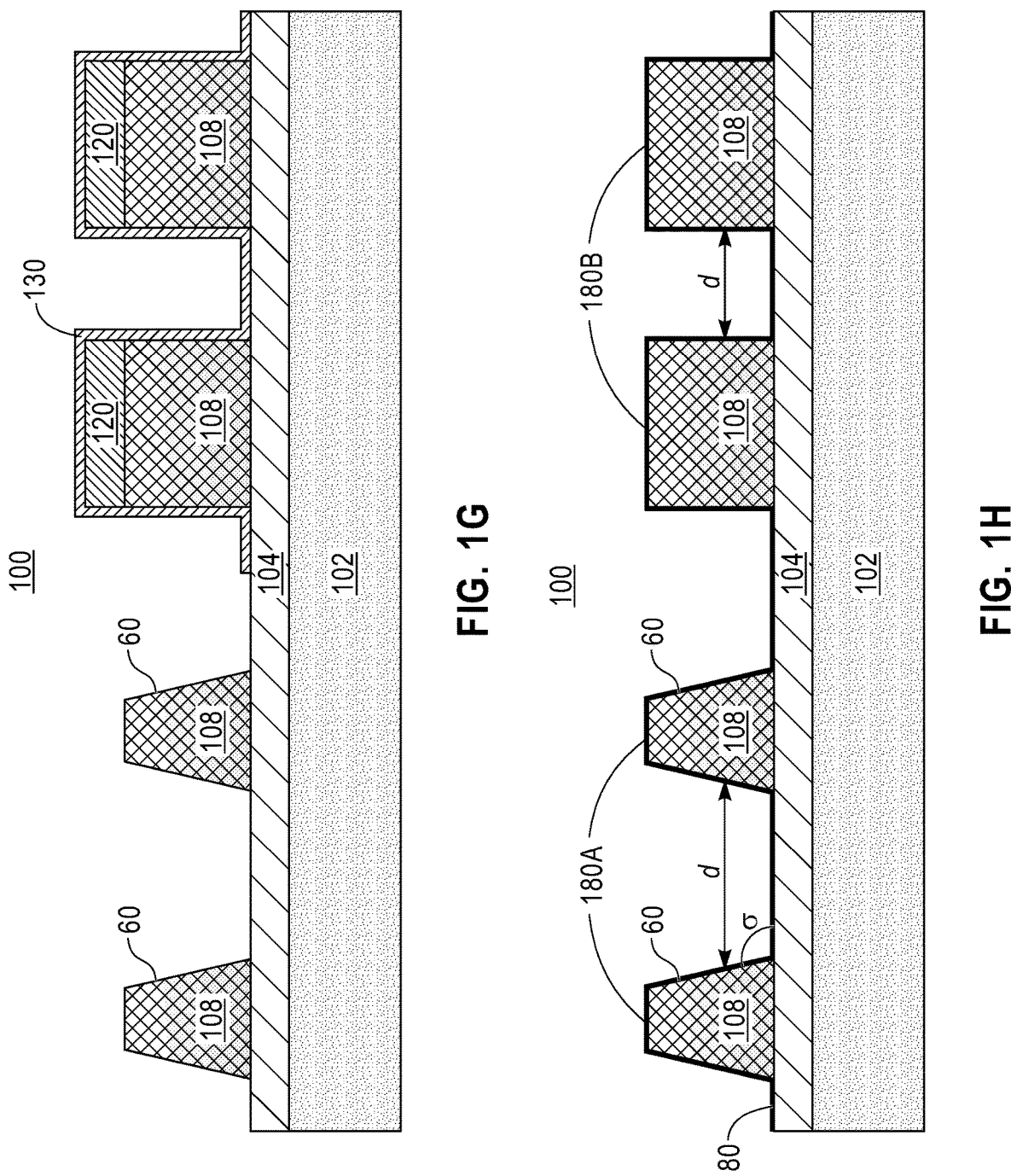
FIG. 1G is a cross-sectional view of the first semiconductor structure depicting selectively removing a first hardmask layer, according to an embodiment of the present disclosure.
FIG. 1H is a cross-sectional view of the first semiconductor structure depicting forming a first plurality of mandrel structures, according to an embodiment of the present disclosure.

Referring now to FIGS. 1F-1H simultaneously, cross-sectional views of the first semiconductor structure 100 are shown after conducting an etching process on exposed portions of the first epitaxial layer 108, selectively removing remaining portions of the second hardmask layer 130 and removing remaining portions of the first hardmask layer 120, according to an embodiment of the present disclosure.

The process continues by selectively recessing exposed portions of the first epitaxial layer 108 with respect to silicon and the first hardmask layer 120 using, for example a high temperature HCl etching in RTCVD reactor. Such process etches SiGe with etch rates proportional to the Ge fraction in the first epitaxial layer 108 thereby forming the trapezoid-like structures 60 depicted in FIG. 1G.

With reference now to FIG. 1G, after the selective etching, the first hardmask layer 120 can be selectively removed from the first semiconductor structure 100 with respect to the first epitaxial layer 108 (i.e., SiGe) using, for example, a wet etch process.

As depicted in FIG. 1H, in one or more embodiments, the second hardmask layer 130 and the first hardmask layer 120 located above the second portions of the first epitaxial layer 108 (adjacent to the trapezoid-like structures 60) can be selectively removed from the first semiconductor structure 100 with respect to the first epitaxial layer 108 using, for example, a wet etch process. In some embodiments, remaining portions of the second hardmask layer 130 and of the first hardmask layer 120 disposed above second portions of the first epitaxial layer 108 may not be removed from the first semiconductor structure 100.

So, portions of the first epitaxial layer 108 remaining above the buried dielectric layer 104 provide a first plurality of mandrel structures 180A, 180B (hereinafter "first mandrel structures") with asymmetric profiles that can be used as mold for nanoimprint lithology and/or optical waveguides in augmented reality displays. For illustration purposes only, without intent of limitation, only four first mandrel structures 180A, 180B are shown in the figures. It should be noted that any number of first mandrel structures 180A, 180B can be formed in the first semiconductor structure 100 to satisfy design requirements.

FIG. 1H depicts first mandrel structures 180A, 180B having asymmetric profiles suitable for use as a template structure for an imprint mask. Specifically, first mandrel structures 180A corresponding to trapezoid-like structures 60 include a reverse tapered profile in which a width or critical dimension (CD) of a top portion of each section of the first epitaxial layer 108 is larger than a width or CD of a bottom portion of each section of the first epitaxial layer 108. Stated differently, a width or CD of each first mandrel structure 180A increases towards the buried dielectric layer 104, as shown in the figure. Each side of the first mandrel structures 180A may have an inclination angle s different from 90 degrees. Thus, in this embodiment, the first epitaxial layer 108 having a graded composition of $Si_{1-x}Ge_x$ allows accurately controlling a profile of the first mandrel structures 180A.

By blocking the second portions of the first epitaxial layer 108 as shown in FIG. 1D, first mandrel structures 180B have vertical or straight sidewalls perpendicular to the buried dielectric layer 104. So, an inclination angle of each side of the first mandrel structures 180B is 90 degrees. Thus, the first semiconductor structure 100, as depicted in FIG. 1H, includes an array of angled mandrel structures (e.g., first mandrel structures 180A) and vertical mandrel structures (e.g., first mandrel structures 180B) that provide a template structure with asymmetric profiles.

According to an embodiment, a distance d (i.e., pitch) between each of the first mandrel structures 180A,180B may vary from approximately 200 nm to approximately 2000 nm. In another embodiment, the distance d between the first mandrel structures 180A, 180B may vary from approximately 400 nm to approximately 1000 nm, although other distances are within the contemplated scope of the invention.

In one or more embodiments, the first mandrel structures 180A, 180B, may be covered with a thin layer of a conformal dielectric material 80 such as, for example, $SiO_2$ or SiN for stability and uniformity purposes. The thin layer of conformal dielectric material 80 may have a thickness varying from approximately 5 to approximately 20 nm, and ranges therebetween, and can be deposited using any conformal deposition process including, but not limited to, CVD, PECVD or ALD.

Figure 1I:
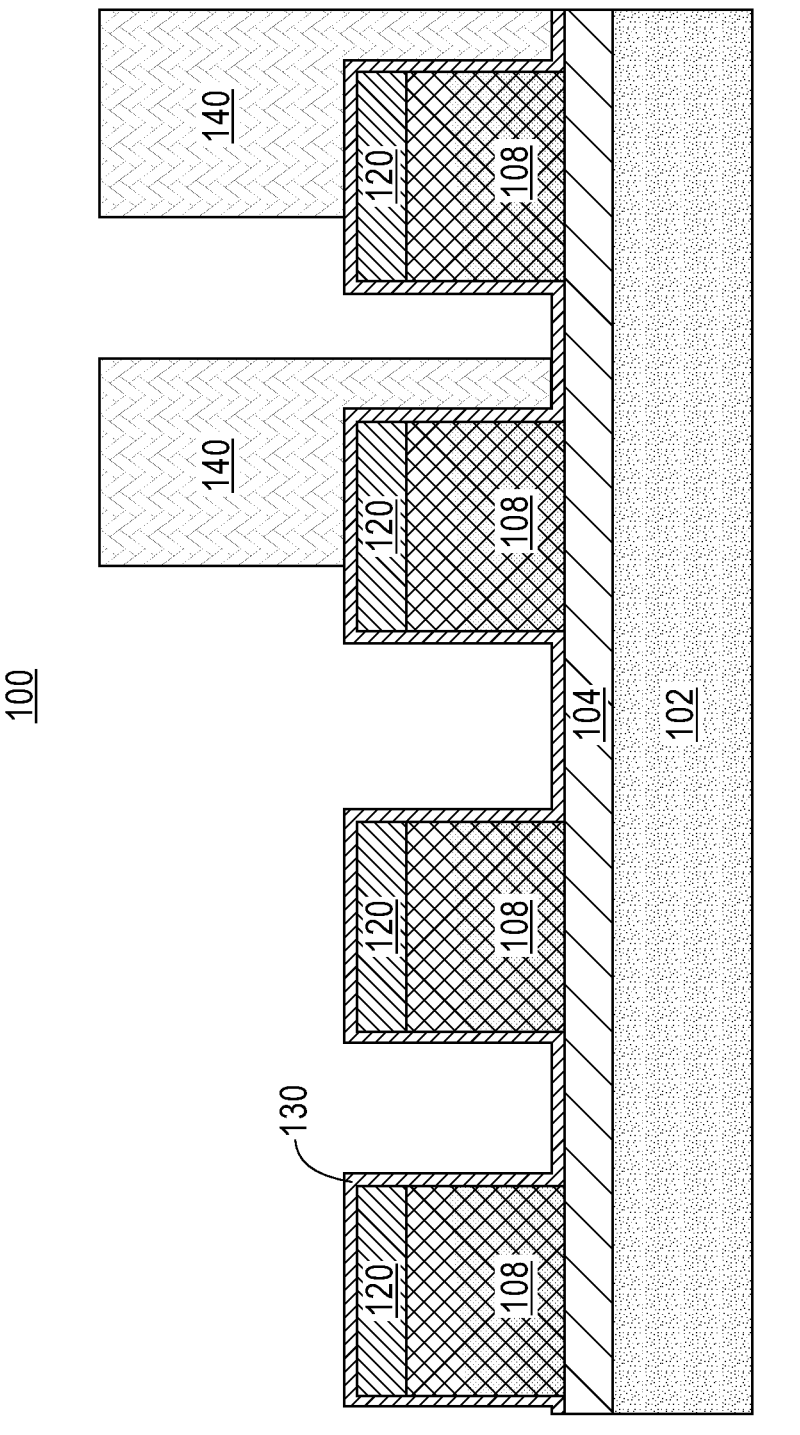
FIG. 1I is a cross-sectional view of the first semiconductor structure depicting the first block mask partially covering portions of the first epitaxial layer, according to an alternate embodiment of the present disclosure.
Figures 1J, 1K:
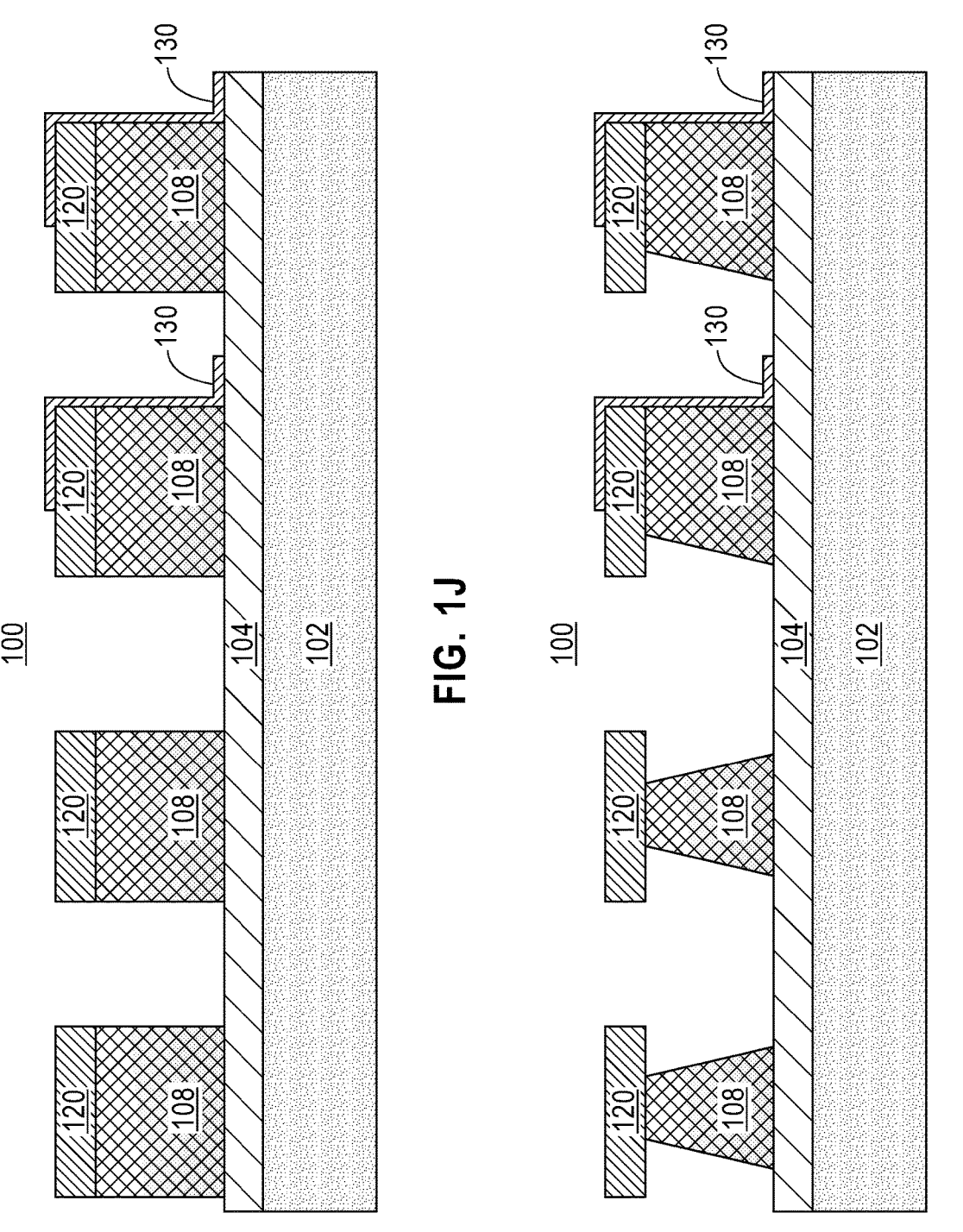
FIG. 1J is a cross-sectional view of the first semiconductor structure depicting selectively etching the second hardmask layer and removing the first block mask, according to an alternate embodiment of the present disclosure.
FIG. 1K is a cross-sectional view of the first semiconductor structure depicting selectively recessing exposed portions of the first epitaxial layer, according to an alternate embodiment of the present disclosure.

With reference now to FIGS. 1I-1L, alternatively, in one or more embodiments, the first block mask 140 can be formed partially covering the second portions of the first epitaxial layer 108, as shown in FIG. 1I. In such embodiments, after selectively etching the second hardmask layer 130 and removing the first block mask 140, a first side of each of the second portions of the first epitaxial layer 108 is exposed (i.e., not covered by the second hardmask layer 130), while a second side of each of the second portions of the first epitaxial layer 108 remains covered by the second hardmask layer 130, as depicted in FIG. 1J.

Figures 1L, 1M, 1N:
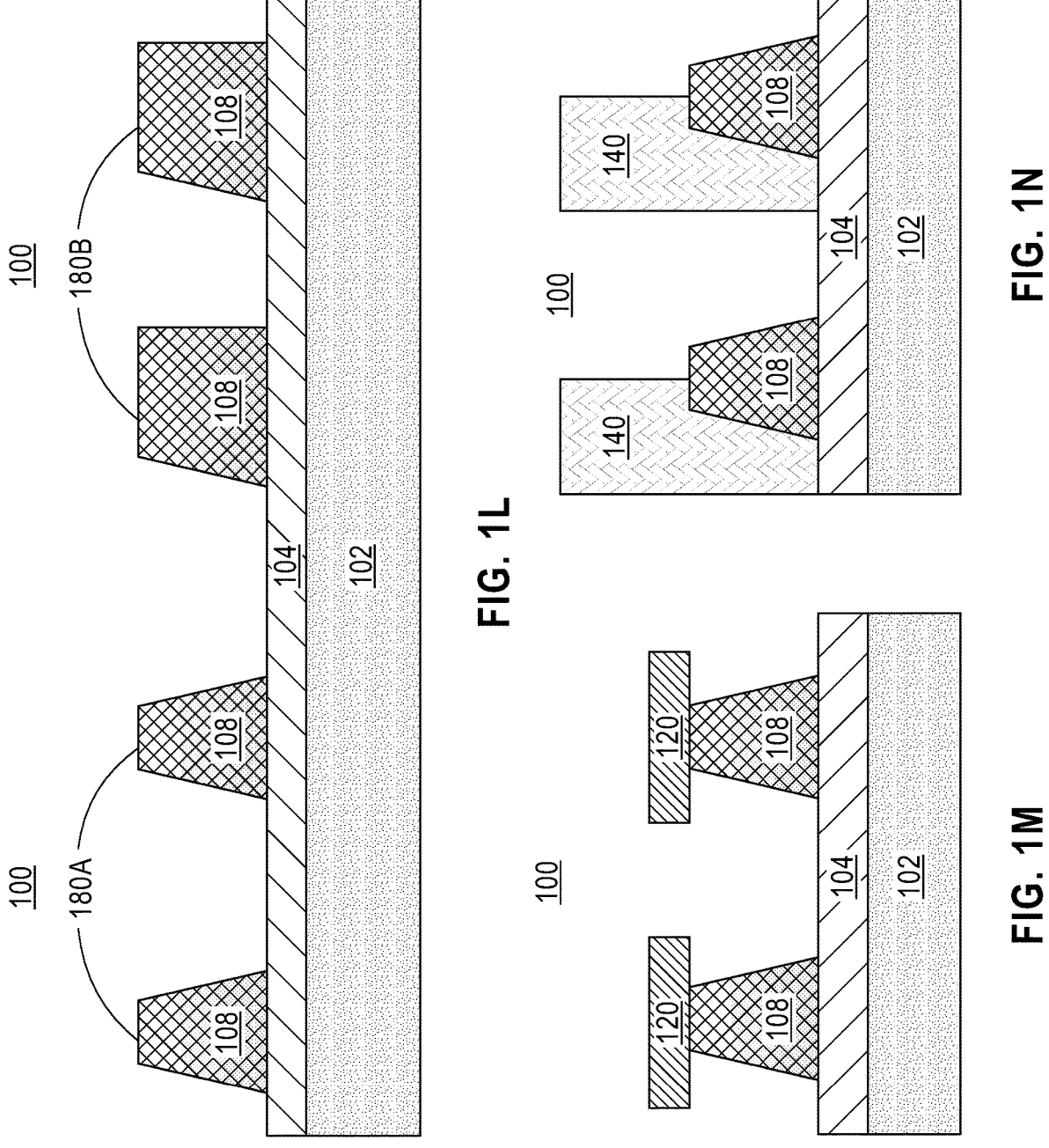
FIG. 1L is a cross-sectional view of the first semiconductor structure depicting removing the remaining second hardmask layer and the first hardmask layer, according to an alternate embodiment of the present disclosure.
FIG. 1M is a cross-sectional view of the first semiconductor structure depicting etching the first epitaxial layer, according to an alternate embodiment of the present disclosure.
FIG. 1N is a cross-sectional view of the first semiconductor structure depicting forming the first block mask on a left side of the first epitaxial layer, according to an alternate embodiment of the present disclosure.

Thus, during the selective etching process, first portions of the first epitaxial layer 108 and the first side of the second portions of the first epitaxial layer 108 can be etched (FIG. 1K) to form mandrel structures with asymmetric profiles, as shown in FIG. 1L. Particularly, after removing the second hardmask layer 130 and removing the first hardmask layer 120, the first mandrel structures 180A, 180B can be simultaneously formed on the same substrate having sides with different inclination angles. Covering the second side with the first block mask 140, as depicted in FIG. 1I, allows the second side of the first epitaxial layer 108 to remain perpendicular to the buried dielectric layer 104, while the first side is exposed to the etch chemistry which causes the first side to have an inclination angle with respect to the horizontal plane, as illustrated in FIG. 1L. As mentioned above, the inclination angle can be tuned by controlling the concentration of Ge atoms within the first epitaxial layer 108.

Figures 1O, 1P, 1Q:
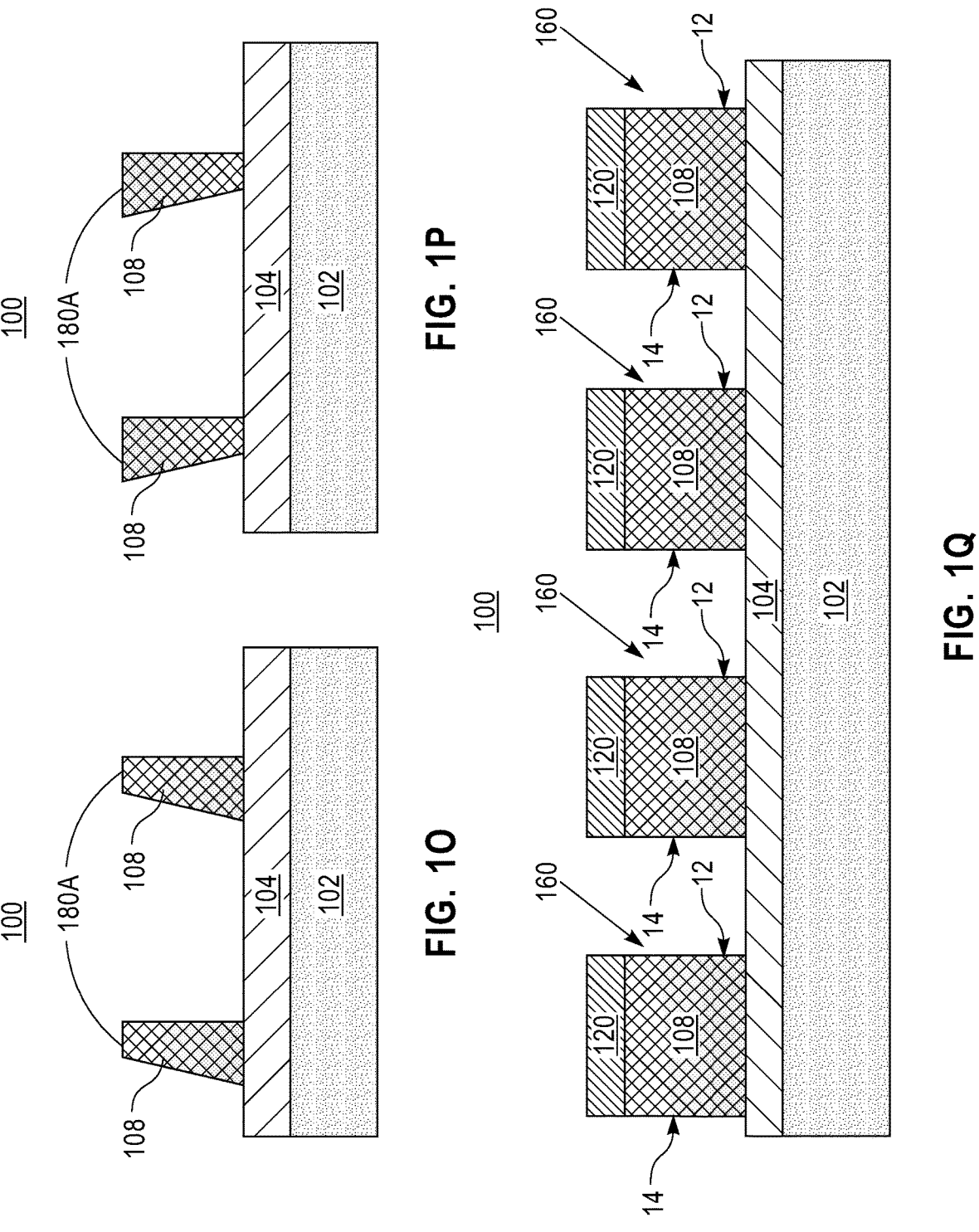
FIG. 1O is a cross-sectional view of the first semiconductor structure depicting selectively recessing exposed portions of the first epitaxial layer and removing the first block mask, according to an alternate embodiment of the present disclosure.
FIG. 1P is a cross-sectional view of the first semiconductor structure depicting forming the first plurality of mandrel structures using an inverse germanium concentration gradient, according to an alternate embodiment of the present disclosure.
FIG. 1Q is a cross-sectional view of the first semiconductor structure depicting conducting an angled ion implantation to introduce dopants to a first surface of the first epitaxial layer, according to an alternate embodiment of the present disclosure.

In some embodiments, as depicted in FIGS. 1M-1O, after etching the first epitaxial layer 108 (FIG. 1M), the first block mask 140 can be formed on a preferred side of the first epitaxial layer 108. In the example of FIG. 1N, the first block mask 140 is formed on the left side of the first epitaxial layer 108. Thus, after conducting a selective RIE process and stripping the first block mask 140, the inclination angle of the first mandrel structures 180A can be modified such that the right side of the first mandrel structures 180A is vertical or straight, and the left side has an angled profile, as depicted in FIG. 1O. In other embodiments, the epitaxial layer 108 may be formed with an inverse Ge concentration gradient, i.e., the concentration of germanium atoms is higher at the bottom end of the epitaxial layer 108 and lower at the top end of epitaxial layer 108. This may cause the resulting first mandrel structures 180A to have the inverse asymmetric profile depicted in FIG. 1P.

With reference now to FIG. 1Q, an alternate embodiment in which an angled ion implantation 160 can be conducted on the first semiconductor structure 100 to introduce dopants to a first surface 12 of the first epitaxial layer 108 is described. A second surface 14 of the first epitaxial layer 108 opposing the first surface 12 is substantially free of dopants.

Angled ion implantation 160 implants dopants towards the first surface 12 of the first epitaxial layer 108. In one or more embodiments, a minimum ion implantation angle is governed by the pitch of the patterned first epitaxial layer 108 and shadowing effect by the neighboring first epitaxial layer 108 pillars to ensure the ions reach out the bottom right side of first epitaxial layer 108. In an embodiment, the angled ion implantation 160 can be conducted at an implantation angle ranging from approximately 25° to approximately 75°. In another embodiment, the angled ion implantation 160 includes an implantation angle ranging from approximately 40° to approximately 60°.

Figures 1R, 1S:
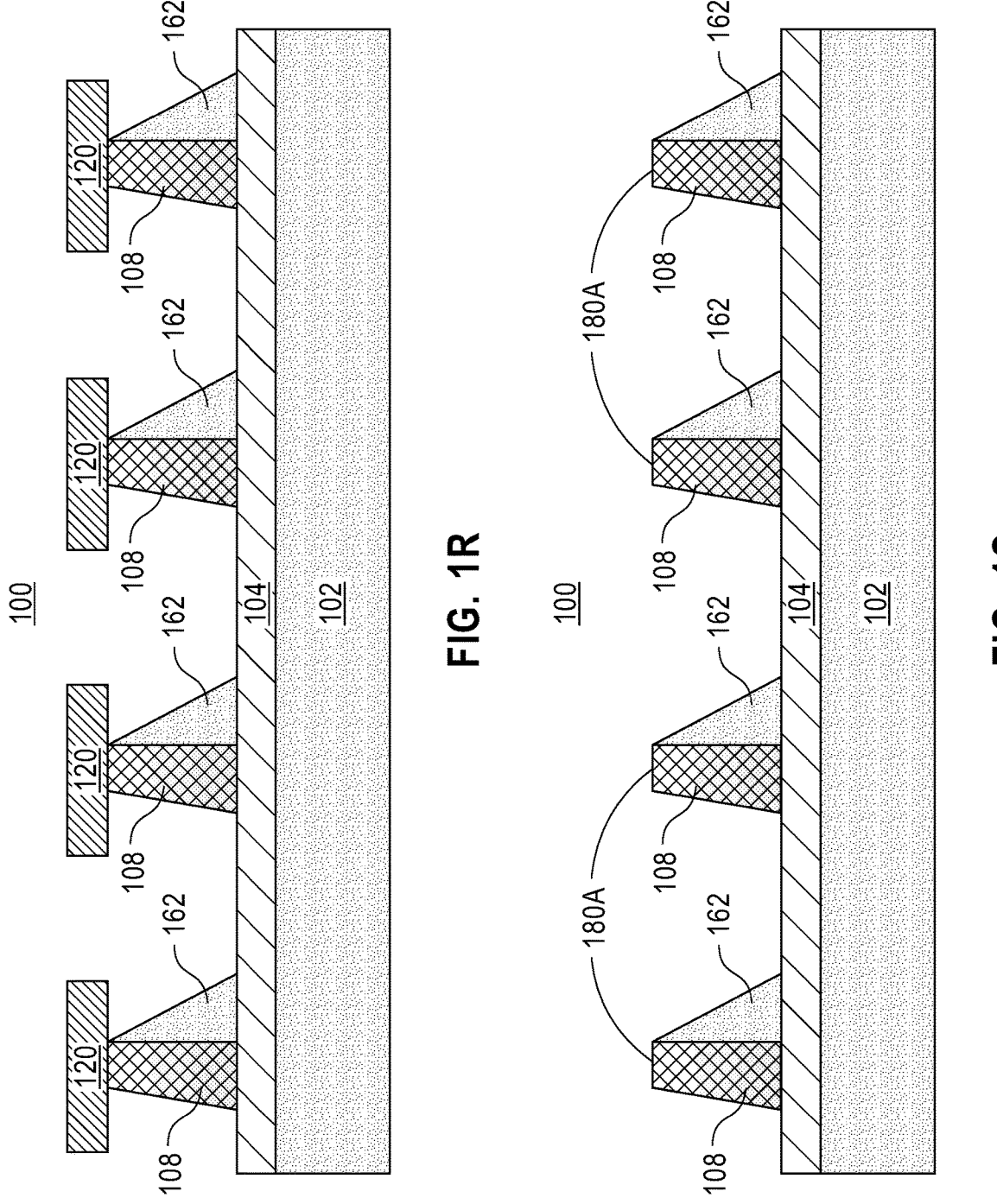
FIG. 1R is a cross-sectional view of the first semiconductor structure depicting forming a doped region, according to an alternate embodiment of the present disclosure.
FIG. 1S is a cross-sectional view of the first semiconductor structure depicting selectively removing the first hardmask layer, according to an alternate embodiment of the present disclosure.

The angled ion implantation 160 forms a doped region 162 adjacent to undoped portions of the first epitaxial layer 108, as depicted in FIG. 1R. In a preferred embodiment, the dopants are composed of boron. It is noted that other dopants are also contemplated and are within the scope of the invention.

In an embodiment, the angled ion implantation 160 may include a boron dopant and may employ an implant having an ion dosage ranging from $1 \times 10^{13}$ atoms/cm$^2$ to $5 \times 10^{15}$ atoms/cm$^2$. Thus, the dopant concentration in the doped region 162 may range from approximately $1 \times 10^{18}$ atoms/cm$^3$ to approximately $8 \times 10^{21}$ atoms/cm$^3$. In another embodiment, the dopant concentration in the doped region 162 may vary from approximately $1 \times 10^{19}$ atoms/cm$^3$ to approximately $3 \times 10^{20}$ atoms/cm$^3$. Preferably, the dopant concentration in the doped region 162 ranges from approximately $3 \times 10^{19}$ atoms/cm$^3$ to approximately $1 \times 10^{20}$ atoms/cm$^3$.

In an exemplary embodiment, the angled ion implantation 160 may be carried out using an ion implant apparatus that operates at an energy ranging from approximately 5.0 keV to approximately 60.0 keV. In another embodiment, the angled ion implantation 160 may be carried out using an energy varying from approximately 10.0 keV to approximately 40.0 keV. The angled ion implantation 160 may be carried out at a temperature ranging from approximately 50° C. to approximately 500° C. In another embodiment, the angled ion implantation is carried out with a temperature ranging from approximately 100° C. to approximately 300° C.

The term "substantially free of the dopants" as used to describe the second surface 14 of the first epitaxial layer 108 means that the dopant concentration is less than approximately $1 \times 10^{16}$ atoms/cm$^3$.

Figures 1T, 1U:
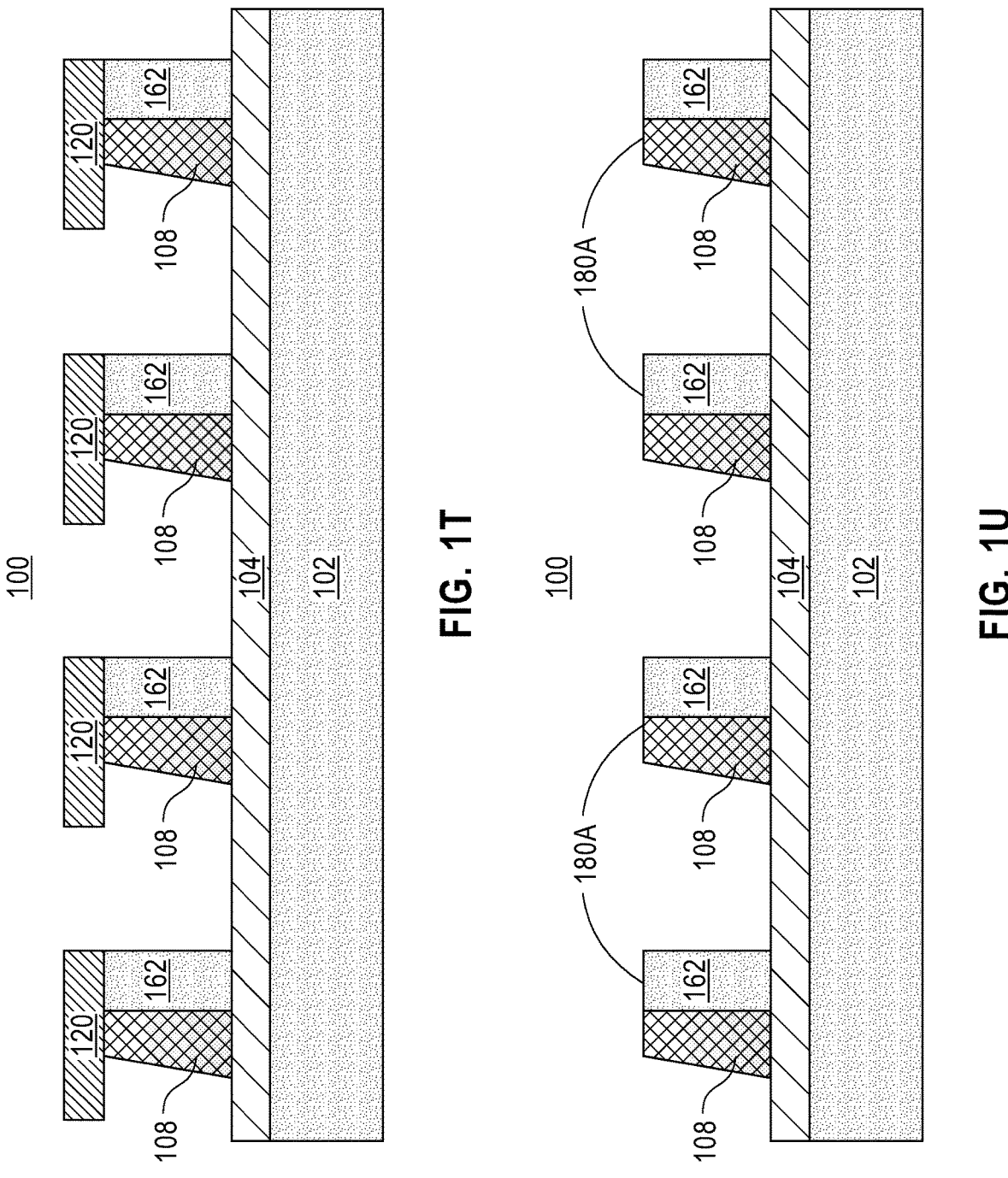
FIG. 1T is a cross-sectional view of the first semiconductor structure depicting forming the doped region with a different inclination angle, according to an alternate embodiment of the present disclosure.
FIG. 1U is a cross-sectional view of the first semiconductor structure depicting selectively removing the first hardmask layer, according to an alternate embodiment of the present disclosure.

As shown in FIG. 1S, after conducting the angled ion implantation 160 and forming the doped region 162, a selective etch process with respect to the mask layer 120 and buried dielectric layer 104 can be conducted to form first mandrel structures 180A, 180B with asymmetric profiles. The mask layer 120 can be subsequently removed from the first semiconductor structure 100 using a selective wet or dry etch process. In this embodiment, by changing the dopant concentration and/or implant depth in the doped region 162, first mandrel structures 180A with different configurations can be achieved in the first semiconductor structure 100, as depicted in FIGS. 1T-1U.

Another embodiment by which mandrel structures with asymmetric profiles can be formed is described in detail below by referring to the accompanying drawings in FIGS. 2A-2F.

Figure 2A:
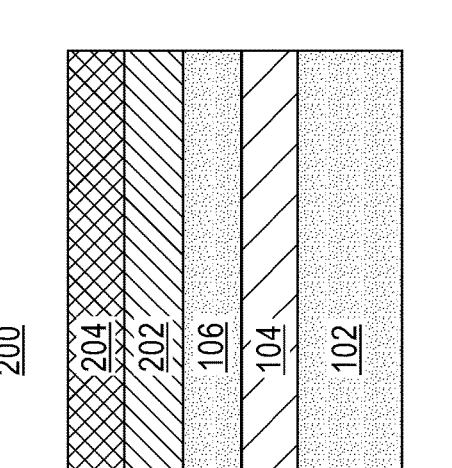
FIG. 2A is a cross-sectional view of a second semiconductor structure depicting a starting semiconductor substrate including a thinned silicon-on-insulator layer, according to another embodiment of the present disclosure.
Figure 2B:
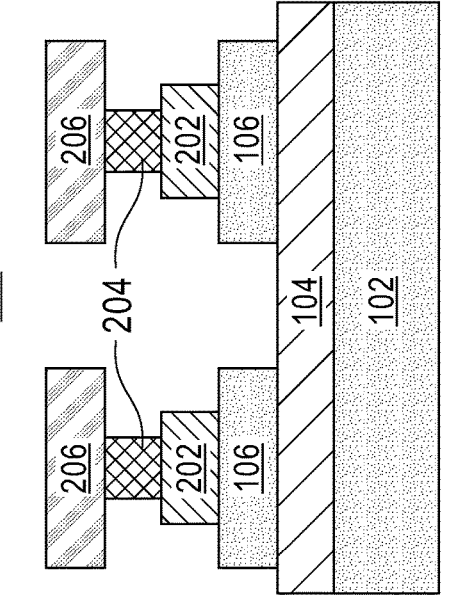
FIG. 2B is a cross-sectional view of the second semiconductor structure depicting forming a second epitaxial layer above the silicon-on-insulator layer and forming a third epitaxial layer above the third epitaxial layer, according to another embodiment of the present disclosure.
Figure 2C:
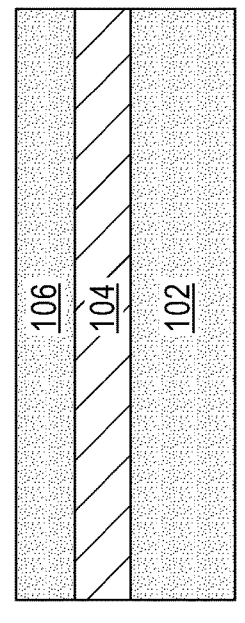
FIG. 2C is a cross-sectional view of the second semiconductor structure depicting forming a third hardmask layer and patterning the silicon-on-insulator layer, second epitaxial layer and third epitaxial layer, according to another embodiment of the present disclosure.
Figure 2D:
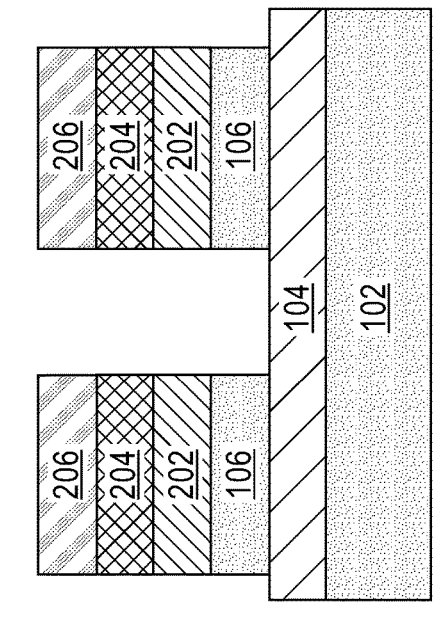
FIG. 2D is a cross-sectional view of the second semiconductor structure depicting selectively recessing the second epitaxial layer and third epitaxial layer with respect to the third hardmask layer and silicon-on-insulator layer to form staircase-like structures, according to an embodiment of the present disclosure.

Referring now to FIGS. 2A-2B simultaneously, cross-sectional views of a second semiconductor structure 200 are shown after reducing a thickness of an SOI layer 106, forming a second epitaxial layer 202 above and in direct contact with the SOI layer 106, and forming a third epitaxial layer 204 above and in direct contact with the third epitaxial layer 204, according to an embodiment of the present disclosure.

In the depicted embodiment, the initial second semiconductor structure 200 is substantially similar to the one described above with reference to FIG. 1A. Although, in the present embodiment, SOI layer 106 is depicted in the figures. Similar to the embodiment of FIG. 1A, the SOI layer 106 disposed above the buried dielectric layer 104 have been thinned using, for example, an oxidation process followed by DHF cleaning. Accordingly, in the depicted embodiment, a thickness of the SOI layer 106 may vary from approximately 1 nm to approximately 10 nm, and ranges therebetween. The substantially thin SOI layer 106 may function as a seed layer for the epitaxial growth process conducted to form the second epitaxial layer 202 and the third epitaxial layer 204.

The process of epitaxially growing the second epitaxial layer 202 and the third epitaxial layer 204 includes similar steps as those used to form the first epitaxial layer 108 described above in FIG. 1A, i.e., using the thinned SOI layer 106 as seed layer. In this embodiment, the second epitaxial layer 202 and the third epitaxial layer 204 form a step graded silicon-germanium (SiGe) layer.

A step graded layer includes a series of distinct steps or layers, each step having a slightly different chemical composition. For example, in this embodiment, the step graded SiGe layer has two steps. A first step (formed by the second epitaxial layer 202) includes 20% Ge and 80% Si, and a second step (formed by the third epitaxial layer 204) includes 40% Ge and 60% Si. In one or more embodiments, to determine the number of steps necessary, one can set the beginning and ending compositions, and the degree of change in the composition between steps. The smaller the degree of change in chemical composition between steps, the greater the number of steps needed. In general, the first step of the step graded SiGe layer (i.e., second epitaxial layer 202) has a Ge concentration given by $Si_{1-x}Ge_x$, and the second step of the step graded SiGe layer (i.e., third epitaxial layer 204) has a Ge concentration given by $Si_{1-y}Ge_y$, where x<y. Thus, the concentration of germanium atoms is higher in the third epitaxial layer 202 and lower in the second epitaxial layer 202.

In an exemplary embodiment, the second epitaxial layer 202 and the third epitaxial layer 204 may be epitaxially grown to a thickness varying between approximately 100 nm and 500 nm, although other thicknesses are within the contemplated scope of the invention. Preferably, the second epitaxial layer 110 is grown to a thickness varying between approximately 300 nm and 400 nm.

Referring now to FIGS. 2C-2F simultaneously, cross-sectional views of the second semiconductor structure 200 are shown after forming a third hardmask layer 206 above the third epitaxial layer 204, selectively etching the SOI layer 106, second epitaxial layer 202 and third epitaxial layer 204, masking selected portions of the SOI layer 106, second epitaxial layer 202 and third epitaxial layer 204, and forming a second plurality of mandrel structures 230, according to an embodiment of the present disclosure.

The third hardmask layer 206 is formed above and in direct contact with the third epitaxial layer 204. Similar to the first hardmask layer 120 (FIG. 1A), the third hardmask layer 206 is composed of a dielectric material such as, for example, silicon dioxide, silicon nitride, silicon carbide, or a combination of such materials forming a multiple stack hardmask. Any known dielectric deposition process can be conducted to form the third hardmask layer 206. In an exemplary embodiment, a thickness of the third hardmask layer 206 may vary from approximately 10 nm to approximately 200 nm and ranges therebetween, although a thickness less than 10 nm and greater than 200 nm may be acceptable.

In one or more embodiments, the SOI layer 106, second epitaxial layer 202 and third epitaxial layer 204 can be etched selective to the third hardmask layer 206 and buried dielectric layer 104. For example, a RIE process can be used to selectively etch the SOI layer 106, second epitaxial layer 202 and third epitaxial layer 204, as configured in FIG. 2C.

The process continues by selectively recessing the second epitaxial layer 202 and third epitaxial layer 204, with respect to silicon (i.e., SOI layer 106) and the third hardmask layer 206 using, for example a high temperature HCl etching in RTCVD reactor. Such process etches SiGe with etch rates proportional to the Ge fraction in the second epitaxial layer 202 and third epitaxial layer 204 forming the stepped or staircase-like structures depicted in FIG. 2D.

Figures 2E, 2F, 3A:
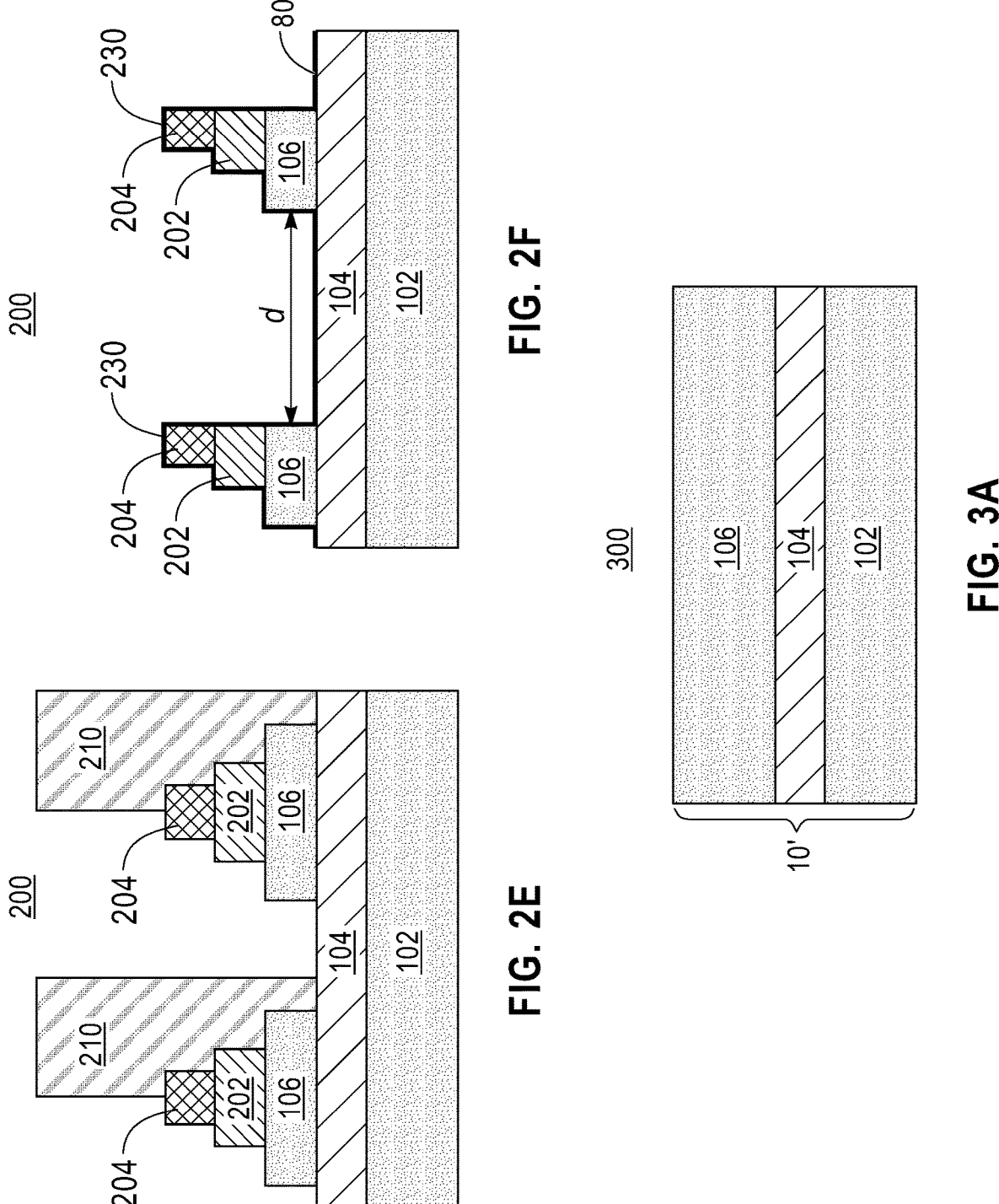
FIG. 2E is a cross-sectional view of the second semiconductor structure depicting forming a block mask, according to an embodiment of the present disclosure.
FIG. 2F is a cross-sectional view of the second semiconductor structure depicting etching selected portions of the second epitaxial layer, third epitaxial layer and silicon-on-insulator layer to form a second plurality of mandrel structures, according to an embodiment of the present disclosure.
FIG. 3A is a cross-sectional view of a third semiconductor structure depicting a starting semiconductor substrate including a silicon-on-insulator layer, according to another embodiment of the present disclosure.

With reference now to FIG. 2E, the third hardmask layer 206 can be removed from the second semiconductor structure 200 selective to silicon layers (i.e., second epitaxial layer 202 and third epitaxial layer 204). For example, the second hardmask layer 114 can be remove using a hot phosphoric acid etching. The third hardmask layer 206 can be remove using, for example, a HCl chemistry in an epitaxial or RTCVD reactor.

The process continues by depositing and lithographically defining a photoresist layer on selected portions of the SOI layer 106, second epitaxial layer 202 and third epitaxial layer 204 to form a block mask 210; and selectively etching uncovered portions of the SOI layer 106, second epitaxial layer 202 and third epitaxial layer 204 using the block mask 210. As depicted in FIG. 2F, after selectively removing the uncovered portions of the SOI layer 106, second epitaxial layer 202 and third epitaxial layer 204, the block mask 210 can be removed using any photoresist striping method known in the art including, for example, plasma ashing.

So, portions of the SOI layer 106, second epitaxial layer 202 and third epitaxial layer 204 remaining above and in contact with the buried dielectric layer 104 provide a second plurality of mandrel structures 230 (hereinafter "second mandrel structures") with asymmetric profile that can be used as mold for nanoimprint lithology and/or optical waveguides in augmented reality displays.

For illustration purposes only, without intent of limitation, only two second mandrel structures 230 are shown in the figures. It should be noted that any number of second mandrel structures 230 can be formed in the second semiconductor structure 200 to satisfy design requirements. As shown in FIG. 2F, a first side of each of the second mandrel structures 230 has a stepped profile, while a second side of each of the second mandrel structures 230, opposing the first side, has a straight perpendicular profile with respect to a surface plane of the buried dielectric layer 104. Thus, in this embodiment, the step graded SiGe layer formed by the second epitaxial layer 202 and the third epitaxial layer 204 allows accurately controlling a profile of the second mandrel structures 230.

According to an embodiment, a distance d (i.e., pitch) between second mandrel structures 230 may vary from approximately 200 nm to approximately 2000 nm. In another embodiment, the distance d between the second mandrel structures 230 may vary from approximately 400 nm to approximately 1000 nm, although other distances are within the contemplated scope of the invention.

Similar to the first mandrel structures 180A, 180B, the second mandrel structures 230 may be covered with a thin layer of a conformal dielectric material 80 such as, for example, $SiO_2$ or SiN for stability and uniformity purposes. The thin layer of conformal dielectric material 80 may have a thickness varying from approximately 5 to approximately 20 nm, and ranges therebetween, and can be deposited using any conformal deposition process including, but not limited to, CVD, PECVD or ALD.

Another embodiment by which mandrel structures with asymmetric profiles can be formed is described in detail below by referring to the accompanying drawings in FIGS. 3A-3K. In this embodiment, FIGS. 3A-3E below describe a process for forming a plurality of angled mandrel structures 310 that provide an initial structure to form mandrel structures 310 with asymmetric profiles (i.e., opposite sides with different inclination angles with respect to a surface plane of the substrate).

Referring now to FIG. 3A, a cross-sectional view of a third semiconductor structure 300 at an intermediate step during a semiconductor manufacturing process is shown, according to an embodiment of the present disclosure.

At this step of the semiconductor manufacturing process, the third semiconductor structure 300 includes a substrate 10' substantially similar to the substrate 10 depicted in FIG. 2A. However, in this embodiment, a thickness of the SOI layer 106 may preferably vary between approximately 250 nm and approximately 300 nm. Although, in some embodiments, the SOI layer 106 may have a thickness of up to 500 nm. As may be known by those skilled in the art, in some embodiments, the SOI layer 106 may be entirely consumed during subsequent patterning processes.

Figures 3B, 3C, 3D, 3E:
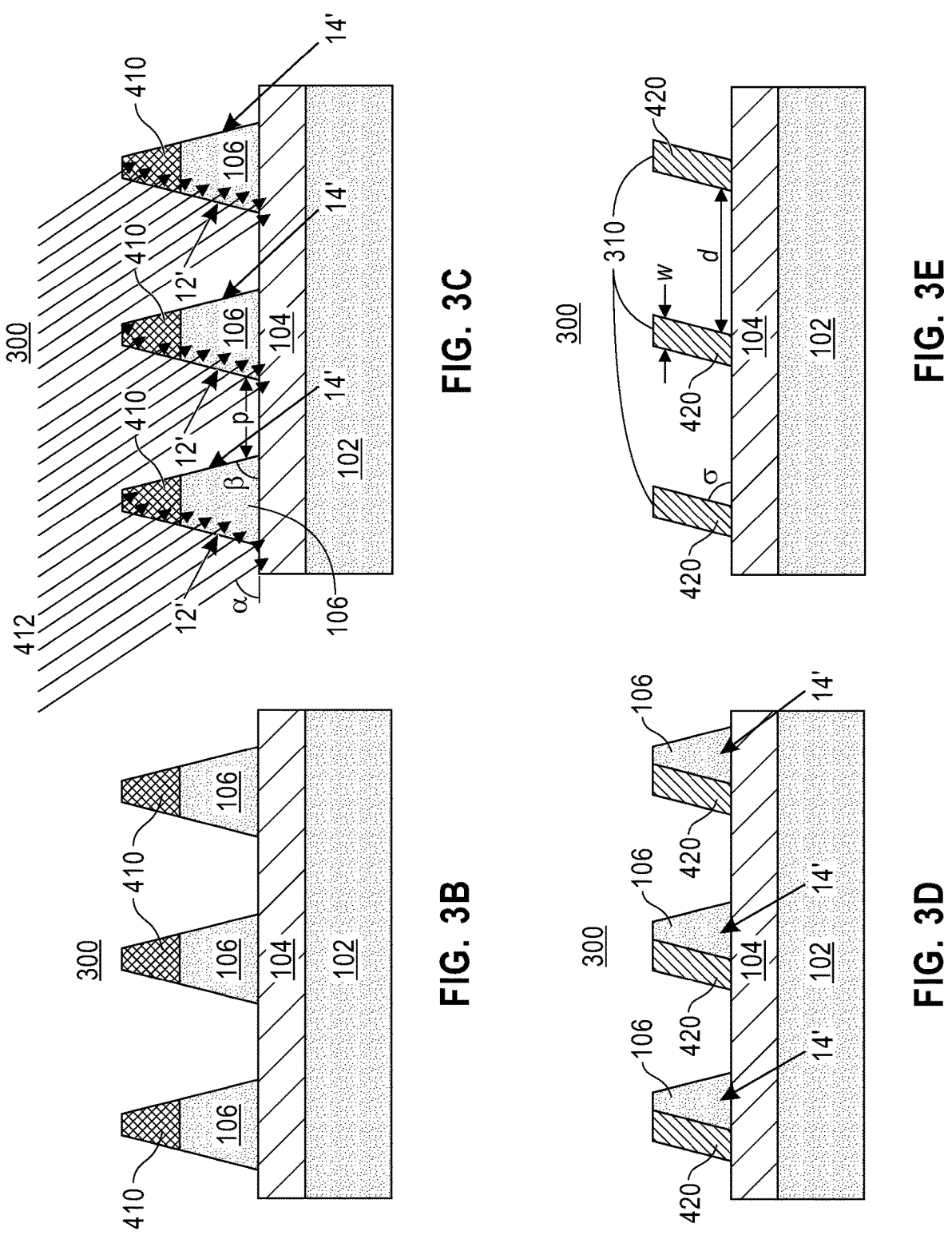
FIG. 3B is a cross-sectional view of the third semiconductor structure depicting forming a mask layer and conducting an etching process on the silicon-on-insulator layer, according to another embodiment of the present disclosure.
FIG. 3C is a cross-sectional view of the third semiconductor structure depicting conducting an ion implantation process on the silicon-on-insulator layer, according to another embodiment of the present disclosure.
FIG. 3D is a cross-sectional view of the third semiconductor structure depicting forming a doped region, according to an embodiment of the present disclosure.
FIG. 3E is a cross-sectional view of the third semiconductor structure depicting selectively removing remaining portions of the silicon-on-insulator layer to form a third plurality of mandrel structures, according to another embodiment of the present disclosure.

Referring now to FIG. 3B, a cross-sectional view of the third semiconductor structure 300 is shown after forming a mask layer 410 and conducting an etching process, according to an embodiment of the present disclosure.

The mask layer 410 is formed above and in direct contact with the SOI layer 106. In one or more embodiments, the mask layer 410 may be a hard mask composed of a dielectric material such as, for example, silicon dioxide, silicon nitride, silicon carbide, or a combination of such materials forming a multiple stack hardmask. Any known dielectric deposition process can be conducted to form the mask layer 410.

In other embodiments, the mask layer 410 may be a soft mask made of any organic planarizing material that is capable of effectively preventing damage of underlying layers during subsequent etching processes. In such embodiments, the mask layer 410 can include, but is not necessarily limited to, an organic polymer including C, H, and N. According to an embodiment, the organic planarizing material can be free of silicon (Si). According to another embodiment, the organic planarizing material can be free of Si and fluorine (F). As defined herein, a material is free of an atomic element when the level of the atomic element in the material is at or below a trace level detectable with analytic methods available in the art. Non-limiting examples of organic planarizing material for forming the mask layer 410 may include JSR HM8006, JSR HM8014, AZ UM10M2, Shin Etsu ODL 102, or other similar commercially available materials. The mask layer 410 may be deposited by, for example, spin coating followed by a planarization process, such as a chemical mechanical polishing (CMP).

A thickness of the mask layer 410 may vary from approximately 50 nm to approximately 1000 nm and ranges therebetween, although a thickness less than 50 nm and greater than 200 nm may be acceptable.

With continued reference to FIG. 3B, a lithography process can be conducted on the mask layer 410 followed by a reactive ion etch (RIE) to achieve tapered sidewalls in the SOI layer 106, as depicted in the figure. More particularly, after the lithography and RIE processes, the SOI layer 106 is divided into a plurality of sections with angled or tapered sidewalls. In the depicted embodiment, the remaining sections of the SOI layer 106 include a reverse tapered profile in which a width or critical dimension (CD) of a top portion of each section of the SOI layer 106 is larger than a width or CD of a bottom portion of each section of the SOI layer 106. Stated differently, after conducting the lithography process, the width or CD of each section of the SOI layer 106 increases towards the buried dielectric layer 104, as shown in the figures.

Referring now to FIGS. 3C-3D simultaneously, cross-sectional views of the third semiconductor structure 300 are shown after conducting an ion implantation process on the SOI layer 106 to form a doped region 420, according to an embodiment of the present disclosure.

In this embodiment, an angled ion implantation 412 can be conducted on the semiconductor structure 100 to introduce dopants to a first surface 12' of the SOI layer 106. A second surface 14' of the SOI layer 106 opposing the first surface 12' is substantially free of dopants.

In a preferred embodiment, the dopants are composed of boron. It is noted that other dopants are also contemplated and are within the scope of the invention, so long as the dopants allow for selective etching between the doped region 420 in which the dopants are present and the second surface 14' of the SOI layer 106 that is substantially free of the dopants.

Angled ion implantation 412 implants dopants towards a surface of the first surface 12' of the SOI layer 106 forming an implantation angle a with the horizontal plane. In one or more embodiments, the implantation angle a is less or equal than an inclination angle b ($a \leq b$) of a sidewall of the SOI layer 106 corresponding to the second surface 14'. In addition, the minimum angle a is governed by the pitch p of the patterned SOI layer 106 and shadowing effect by the neighboring SOI layer 106 pillars to ensure the ions reach out a bottom surface of the first surface 12' of the SOI layer 106 depicted in FIG. 1C. In an embodiment, the angled ion implantation 412 can be conducted at an implantation angle a ranging from approximately 25° to approximately 75°. In another embodiment, the angled ion implantation 412 includes an implantation angle a ranging from approximately 40° to approximately 60°.

In an embodiment, the angled ion implantation 412 may include a boron dopant and may employ an implant having an ion dosage ranging from $1 \times 10^{13}$ atoms/cm$^2$ to $5 \times 10^{15}$ atoms/cm$^2$. Thus, the dopant concentration in the doped region 420 may range from approximately $1 \times 10^{18}$ atoms/cm$^3$ to approximately $8 \times 10^{21}$ atoms/cm$^3$. In another embodiment, the dopant concentration in the doped region 420 may vary from approximately $1 \times 10^{19}$ atoms/cm$^3$ to approximately $3 \times 10^{20}$ atoms/cm$^3$. Preferably, the dopant concentration in the doped region 420 ranges from approximately $3\times10^{19}$ atoms/cm$^3$ to approximately $1\times10^{20}$ atoms/cm$^3$.

In an exemplary embodiment, the angled ion implantation 412 may be carried out using an ion implant apparatus that operates at an energy ranging from approximately 5.0 keV to approximately 60.0 keV. In another embodiment, the angled ion implantation 412 may be carried out using an energy varying from approximately 10.0 keV to approximately 40.0 keV. The angled ion implantation may be carried out at a temperature ranging from approximately 50° C. to approximately 500° C. In another embodiment, the angled ion implantation is carried out with a temperature ranging from approximately 100° C. to approximately 300° C.

The term "substantially free of the dopants" as used to describe the remaining (second) surface 14 of the SOI layer 106 means that the dopant concentration is less than approximately $1\times10^{16}$ atoms/cm$^3$.

After conducting the angled ion implantation 412 and forming the doped region 420, the mask layer 410 can be removed from the first semiconductor structure 100 using a selective wet or dry etch process.

Referring now to FIG. 3E, a cross-sectional view of the third semiconductor structure 300 is shown after selectively removing a remaining portion of the SOI layer 106 depicted in FIG. 3D, according to an embodiment of the present disclosure.

Remaining portions of the SOI layer 106 (FIG. 3D) corresponding to the second surface 14' (FIG. 3D) can be selectively removed with respect to the buried dielectric layer 104 and doped region 420 using, for example, a HCl chemistry in an epitaxial or rapid thermal chemical vapor deposition (RTCVD) reactor. Thus, in the depicted embodiment, the doped regions 420 disposed above the buried dielectric layer 104 provide a third plurality of mandrel structures 310 (hereinafter "third mandrel structures") that can be used as a mold for nanoimprint lithography and/or as optical waveguides in augmented reality displays.

For illustration purposes only, without intent of limitation, only three third mandrel structures 310 are shown in the figure. It should be noted that any number of first mandrel structures 310 can be formed in the third semiconductor structure 300 to satisfy design requirements. It should also be noted that an inclination angle s (with respect to the horizontal plane) of the third mandrel structures 310 can be tailored to satisfy design requirements by adjusting operational parameters of the tapered RIE described in FIG. 3B and operational parameters of the angled ion implantation 412. Thus, the third mandrel structures 310 extend outwardly at an inclination angle s with respect to a surface plane of the substrate that is different from 90 degrees. Although not depicted in the figures, the third mandrel structures 310 may have one or more different inclination angles s different from 90 degrees.

Alternatively, or additionally, the third mandrel structures 310 may be covered with a thin layer of a conformal dielectric material (not shown) such as, for example, SiO$_2$ or SiN for stability and uniformity purposes. The thin layer of conformal dielectric material (not shown) may have a thickness varying from approximately 5 to approximately 20 nm, and ranges therebetween, and can be deposited using any conformal deposition process including, but not limited to, CVD, PECVD or ALD.

According to an embodiment, a distance d (i.e., pitch) between third mandrel structures 310 may vary from approximately 100 nm to approximately 2000 nm. In another embodiment, the distance d between the third mandrel structures 310 may vary from approximately 200 nm to approximately 1000 nm, although other distances are within the contemplated scope of the invention. In one or more embodiments, the third mandrel structures 310 may have a width w determined by a depth of the angled ion implantation 412. In an exemplary embodiment, the width w may vary from approximately 50 nm to approximately 500 nm, and ranges therebetween. In another embodiment, the width w may vary from approximately 100 nm to approximately 300 nm.

Thus, the angled ion implantation is conducted into a vertically etched silicon mandrel to reduce the solubility of the implanted silicon in aqueous base (e.g., KOH), the unimplanted silicon is etched leaving an angled structure in place. In this embodiment, the width of the first mandrel structures is determined by the depth of the implant. The resulting doped silicon mandrel structures (i.e., third mandrel structures 310) include an inclination angle with respect to the horizontal plane and high CD uniformity since the mandrels CD is determined by the implant depth.

Referring now to FIGS. 3F-3K simultaneously, cross-sectional views of the third semiconductor structure 300 are shown depicting processing techniques to form a third mandrel structure 310 with an asymmetric profile, according to embodiments of the present disclosure.

Figures 3F, 3G:
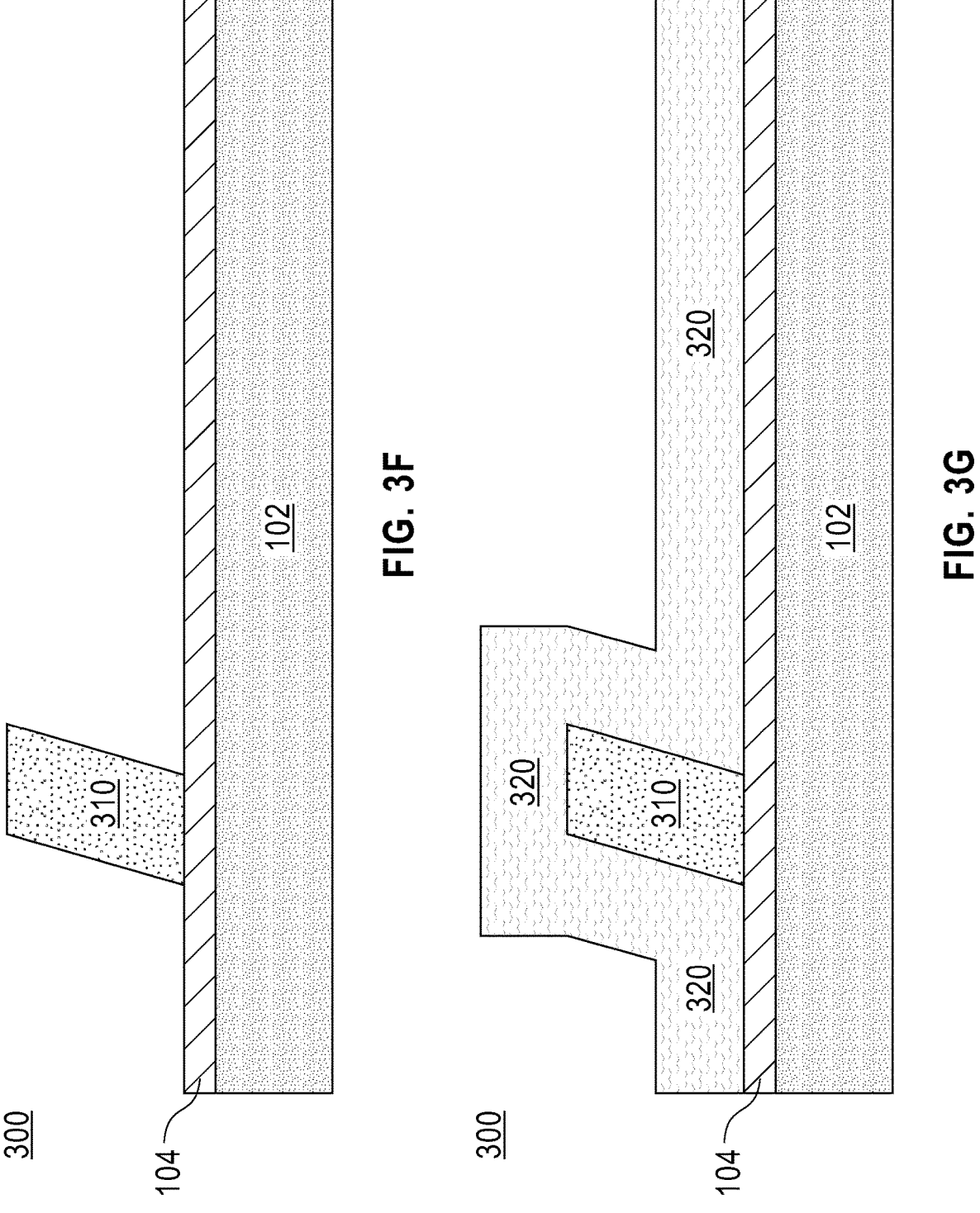
FIG. 3F is a cross-sectional view of the third semiconductor structure depicting a third mandrel structure, according to another embodiment of the present disclosure.
FIG. 3G is a cross-sectional view of the third semiconductor structure depicting forming a first spacer material above the third mandrel structure, according to another embodiment of the present disclosure.

FIG. 3F depicts a third mandrel structure 310 disposed above and in contact with the buried dielectric layer 104. For illustration purposes only, without intent of limitation only one third mandrel structure 310 will be used to described processing steps for forming asymmetric spacers along opposing sidewalls of the third mandrel structure 310 to provide a mandrel structure with asymmetric profile suitable for use as a template structure for an imprint mask.

In one or more embodiments, a conformal layer of a first spacer material 320 can be formed on the third semiconductor structure 100. Specifically, the first spacer material 320 deposits above an uppermost surface and along opposite sidewalls of the third mandrel structure 310, and above uppermost surfaces of the buried dielectric layer 104, as depicted in FIG. 3G. The first spacer material 320 can be formed using well-known deposition processes including, for example, CVD or ALD.

Non-limiting examples of first spacer material 320 may include carbon (C) and conventional low-k materials such as SiO$_2$, SiOC, SiOCN, or SiBCN. Typically, a thickness of the first spacer material 320 may vary from approximately 5 nm to approximately 20 nm, and ranges therebetween.

Figures 3H, 3I:
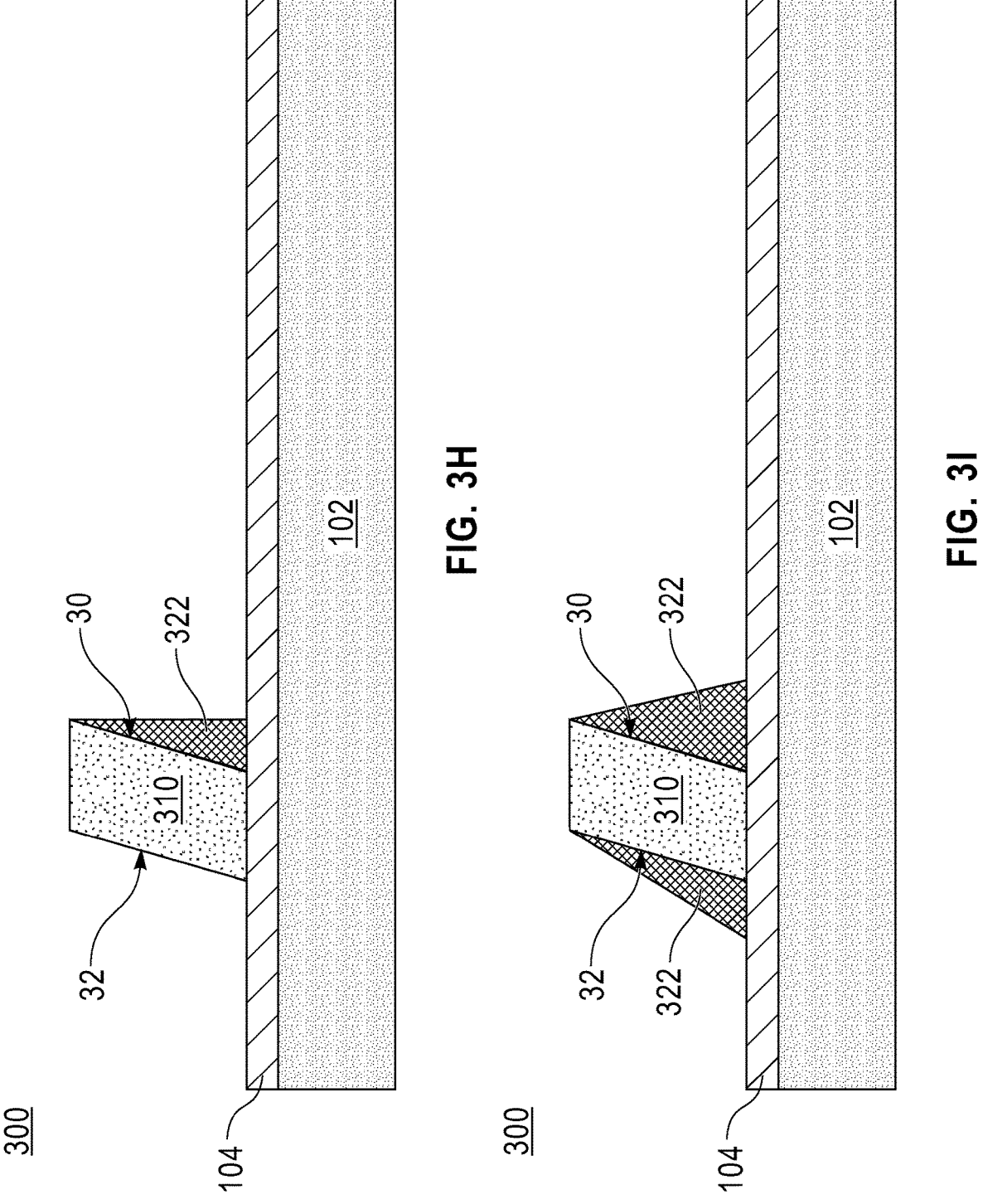
FIG. 3H is a cross-sectional view of the third semiconductor structure depicting etching the first spacer material to form a first sidewall spacer on one side of the third mandrel structure, according to another embodiment of the present disclosure.
FIG. 3I is a cross-sectional view of the third semiconductor structure depicting an alternate way to etch the first spacer material to form the first sidewall spacer on both sides of the third mandrel structure, according to another embodiment of the present disclosure.

A directional RIE can be conducted on the first spacer material 320 to form a first sidewall spacer 322, as depicted in FIG. 3H. In the depicted embodiment, the directional RIE leaves a portion of the first spacer material 320 under the overhang on a first side 30 of the third mandrel structure 310 forming the first sidewall spacer 322 with a vertical or inclination angle substantially similar to 90 degrees. A second side 32 of the third mandrel structure 310 maintains the original inclination angle with respect to a surface plane of the buried dielectric layer 104 since the first spacer material 320 is selectively removed from the second side 32.

In other embodiments, a partially directional RIE with an isotropic component can be conducted on the first spacer material 320 to create non-symmetric first sidewall spacers 322 along opposite sides of the third mandrel structure 310, as depicted in FIG. 3I. In such embodiments, the first spacer material 320 deposits along the first side 30 of the third mandrel structure 310 and along the second side 32 of the third mandrel structure 310. It should be noted that an inclination angle, with respect to a horizontal plane, of the first sidewall spacer 322 disposed along the first side 30 of the third mandrel structure 310 is different from the inclination angle of the first sidewall spacer 322 disposed along the second side 32 of the third mandrel structure 310.

Alternatively, or additionally, to further modify a sidewall profile of the third mandrel structure 310, a second spacer material 340 can be formed on the third semiconductor structure 300 depicted in FIG. 3H. For example, FIG. 3J depicts deposition of the second spacer material 340 conformally along the second side 32 of the third mandrel structure 310, above an uppermost surface of the third mandrel structure 310, and along the first sidewall spacer 322 disposed on the first side 30 of the third mandrel structure 310.

Figures 3J, 3K:
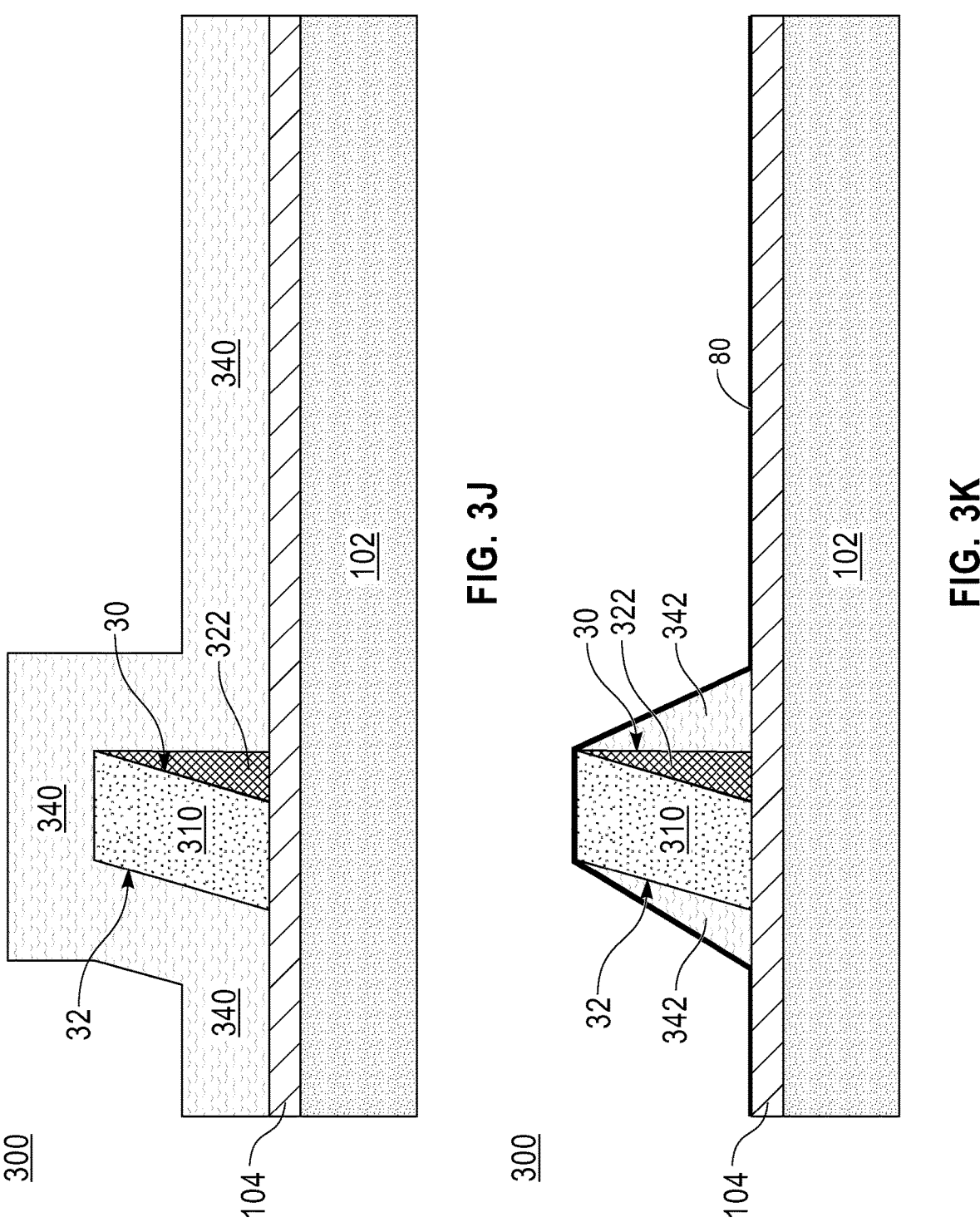
FIG. 3J is a cross-sectional view of the third semiconductor structure depicting forming a second spacer material, according to another embodiment of the present disclosure.
FIG. 3K is a cross-sectional view of the third semiconductor structure depicting etching the second spacer material to form second sidewall spacers on both sides of the third mandrel structure, according to another embodiment of the present disclosure.

A partially directional RIE with an isotropic component can be conducted on the second spacer material 340 to create non-symmetric second sidewall spacers 342 along opposite sides of the third mandrel structure 310, as depicted in FIG. 3K. In this embodiment, the second spacer material 340 deposits along first sidewall spacers 322 on the first side 30 of the third mandrel structure 310 and along the second side 32 of the third mandrel structure 310. Thus, forming the second sidewall spacers 342 allows forming third mandrel structures 310 having opposing sidewalls extending vertically at different inclination angles with respect to the horizontal plane.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
    a first plurality of mandrel structures extending outwardly from a substrate, each of the first plurality of mandrel structures including a first side and a second side, the second side opposing the first side, the first side of each of the first plurality of mandrel structures being at a first inclination angle with respect to a surface plane of the substrate, and the second side of each of the first plurality of mandrel structures being at a second inclination angle with respect to the surface plane of the substrate; and
    a second plurality of mandrel structures extending outwardly from the substrate, each of the second plurality of mandrel structures including a third side and a fourth side, the fourth side opposing the third side, the third side of each of the second plurality of mandrel structures being at a third inclination angle with respect to the surface plane of the substrate, and the fourth side of each of the second plurality of mandrel structures being at a fourth inclination angle with respect to the surface plane of the substrate,
    wherein at least one of the first inclination angle or the second inclination angle differs from at least one of the third inclination angle or the fourth inclination angle, the first plurality of mandrel structures and the second plurality of mandrel structures are adapted for use as a template structure for an imprint mask, the first plurality of mandrel structures and the second plurality of mandrel structures include an epitaxially grown graded semiconductor material, and a first portion of the substrate includes the first plurality of mandrel structures and a second portion of the substrate includes the second plurality of mandrel structures.

2. The semiconductor structure of claim 1, further comprising:

a layer of a conformal dielectric material covering the first plurality of mandrel structures and the second plurality of mandrel structures, the layer of conformal dielectric material providing stability and uniformity to the first plurality of mandrel structures and the second plurality of mandrel structures.

3. The semiconductor structure of claim 1, wherein the first inclination angle and the second inclination angle are different from 90 degrees, and the third inclination angle and the fourth inclination angle are equal to 90 degrees.

4. The semiconductor structure of claim 1, wherein the first inclination angle, the second inclination angle, and the third inclination angle are different from 90 degrees, and the fourth inclination angle is equal to 90 degrees.

5. The semiconductor structure of claim 1, wherein the first inclination angle is similar to the third inclination angle and both are different from 90 degrees, and wherein the second inclination angle is similar to the fourth inclination angle and both are different from 90 degrees and different from the first inclination angle and the third inclination angle.

6. The semiconductor structure of claim 1, wherein the epitaxially grown graded semiconductor material includes a graded silicon-germanium layer, wherein a germanium concentration in the graded silicon-germanium layer is higher at a top end of the graded silicon-germanium layer and lower at a bottom end of the graded silicon-germanium layer.

7. The semiconductor structure of claim 6, wherein the graded silicon-germanium layer has an inverse germanium gradient in which the germanium concentration of the graded silicon-germanium layer is lower at the top end of the graded silicon-germanium layer and higher at the bottom end of the graded silicon-germanium layer.

8. The semiconductor structure of claim 1, further comprising:

a first portion of each of the first plurality of mandrel structures and a first portion of each of the second plurality of mandrel structures including the epitaxially grown graded semiconductor material; and a second portion of each of the first plurality of mandrel structures and a second portion of each of the second plurality of mandrel structures including a doped semiconductor material, the first portion of each of the first plurality of mandrel structures opposing and being in contact with the second portion of each of the first plurality of mandrel structures, and the first portion of each of the second plurality of mandrel structures opposing and being in contact with the second portion of each of the second plurality of mandrel structures.

9. The semiconductor structure of claim 8, wherein the doped semiconductor material includes boron-doped silicon.

10. The semiconductor structure of claim 8, wherein an inclination angle of the second portion of the first plurality of mandrel structures and the second portion of the second plurality of mandrel structures is determined by a dopant concentration.

11. The semiconductor structure of claim 1, wherein the first plurality of mandrel structures and the second plurality of mandrel structures include a step graded layer including two or more steps having a different chemical composition.

12. The semiconductor structure of claim 11, wherein a first step of the two or more steps include a silicon layer, a second step of the two or more steps include a first silicon-germanium layer with a first germanium concentration and located above the silicon layer, and a third step of the two or more steps include a second silicon-germanium layer with a second germanium concentration and located above the first silicon-germanium layer, the second germanium concentration being higher than the first germanium concentration.

13. The semiconductor structure of claim 12, wherein the first side of the first plurality of mandrel structures and the third side of the second plurality of mandrel structures include a stepped profile, and the second side of the first plurality of mandrel structures and the fourth side of the second plurality of mandrel structures include an even and vertical profile with respect to the substrate.

14. A semiconductor structure, comprising:

a first plurality of mandrel structures extending outwardly from a substrate, each of the first plurality of mandrel structures including a first side and a second side, the second side opposing the first side, the first side of each of the first plurality of mandrel structures being at a first inclination angle with respect to a surface plane of the substrate, and the second side of each of the first plurality of mandrel structures being at a second inclination angle with respect to the surface plane of the substrate; and a second plurality of mandrel structures extending outwardly from the substrate, each of the second plurality of mandrel structures including a third side and a fourth side, the fourth side opposing the third side, the third side of each of the second plurality of mandrel structures being at a third inclination angle with respect to the surface plane of the substrate, and the fourth side of each of the second plurality of mandrel structures being at a fourth inclination angle with respect to the surface plane of the substrate, wherein the first plurality of mandrel structures and the second plurality of mandrel structures are adapted for use as a template structure for an imprint mask, and wherein the first inclination angle and the second inclination angle are different from 90 degrees, and the third inclination angle and the fourth inclination angle are equal to 90 degrees.

15. A semiconductor structure, comprising:

a first plurality of mandrel structures extending outwardly from a substrate, each of the first plurality of mandrel structures including a first side and a second side, the second side opposing the first side, the first side of each of the first plurality of mandrel structures being at a first inclination angle with respect to a surface plane of the substrate, and the second side of each of the first plurality of mandrel structures being at a second inclination angle with respect to the surface plane of the substrate; and a second plurality of mandrel structures extending outwardly from the substrate, each of the second plurality of mandrel structures including a third side and a fourth side, the fourth side opposing the third side, the third side of each of the second plurality of mandrel structures being at a third inclination angle with respect to the surface plane of the substrate, and the fourth side of each of the second plurality of mandrel structures being at a fourth inclination angle with respect to the surface plane of the substrate, wherein the first plurality of mandrel structures and the second plurality of mandrel structures are adapted for use as a template structure for an imprint mask, and wherein the first inclination angle, the second inclination angle, and the third inclination angle are different from 90 degrees, and the fourth inclination angle is equal to 90 degrees.

\* \* \* \* \*